(12) United States Patent
Totani

(10) Patent No.: US 10,306,809 B1
(45) Date of Patent: May 28, 2019

(54) SERVER RACK INTEGRATED WITH COLD AIR DELIVERY

(71) Applicant: Yahoo Holdings, Inc., Sunnyvale, CA (US)

(72) Inventor: Mozan Totani, San Jose, CA (US)

(73) Assignee: Oath Inc., New York, NY (US)

( * ) Notice: Subject to any disclaimer, the term of this patent is extended or adjusted under 35 U.S.C. 154(b) by 0 days.

(21) Appl. No.: 15/841,255

(22) Filed: Dec. 13, 2017

(51) Int. Cl.
*H05K 7/20* (2006.01)

(52) U.S. Cl.
CPC ..... *H05K 7/20736* (2013.01); *H05K 7/20754* (2013.01); *H05K 7/20836* (2013.01)

(58) Field of Classification Search
CPC ............ H05K 7/20754; H05K 7/2059; H05K 7/20736–7/20745
See application file for complete search history.

(56) References Cited

U.S. PATENT DOCUMENTS

| | | | | |
|---|---|---|---|---|
| 5,718,628 A * | 2/1998 | Nakazato | ................. | F24F 3/044 454/184 |
| 6,374,627 B1 * | 4/2002 | Schumacher | ............. | G06F 1/20 165/104.33 |
| 7,430,118 B1 * | 9/2008 | Noteboom | ......... | H05K 7/20745 361/695 |
| 9,629,285 B1 * | 4/2017 | Lachapelle | ........ | H05K 7/20145 |
| 9,894,809 B1 * | 2/2018 | Springs | ............. | H05K 7/20745 |
| 10,010,014 B1 * | 6/2018 | Lachapelle | ........ | H05K 7/20718 |
| 2004/0218355 A1 * | 11/2004 | Bash | ....................... | G06F 1/206 361/690 |
| 2006/0260338 A1 * | 11/2006 | VanGilder | ................. | G06F 1/20 62/259.2 |
| 2009/0056910 A1 * | 3/2009 | Mallia | ................. | H05K 7/20754 165/80.3 |
| 2009/0173473 A1 * | 7/2009 | Day | .................... | H05K 7/20754 165/67 |
| 2009/0260384 A1 * | 10/2009 | Champion | ......... | H05K 7/20754 62/259.2 |
| 2010/0085707 A1 * | 4/2010 | Moss | ................... | F24F 11/0001 361/695 |
| 2010/0304657 A1 * | 12/2010 | Gallmann | ................ | G06F 1/20 454/184 |
| 2010/0317278 A1 * | 12/2010 | Novick | ................ | F24F 11/0001 454/184 |
| 2011/0317367 A1 * | 12/2011 | Campbell | .............. | H05K 7/203 361/700 |
| 2012/0063083 A1 * | 3/2012 | Chang | ....................... | G06F 1/20 361/679.47 |
| 2012/0078438 A1 * | 3/2012 | Navas | ................... | F24F 11/0001 700/300 |
| 2013/0091868 A1 * | 4/2013 | Campbell | ............... | F25B 21/02 62/3.2 |
| 2013/0233532 A1 * | 9/2013 | Imwalle | ................. | F28F 27/02 165/287 |

(Continued)

*Primary Examiner* — David M Sinclair
(74) *Attorney, Agent, or Firm* — Penilla IP, APC

(57) ABSTRACT

Server racks that are integrated with cold air delivery are described. Each server rack has a tube having a hollow space therein. The hollow space is used to deliver cold air via one or more valves to one or more servers. The one or more valves are either integrated or fitted to the server racks. The use of the hollow space by itself increases pressure of the cold air. There is no need to use a large fan that consumes a large amount of energy to pressurize the cold air and no need to use a raised floor.

20 Claims, 15 Drawing Sheets

(56) References Cited

U.S. PATENT DOCUMENTS

| | | | |
|---|---|---|---|
| 2013/0280999 A1* | 10/2013 | Takahashi | F24F 9/00 |
| | | | 454/189 |
| 2013/0312846 A1* | 11/2013 | Eriksen | F16L 37/34 |
| | | | 137/315.01 |
| 2014/0014303 A1* | 1/2014 | Rice | H05K 7/20809 |
| | | | 165/104.21 |
| 2014/0024305 A1* | 1/2014 | Fu | H05K 7/1495 |
| | | | 454/184 |
| 2014/0285965 A1* | 9/2014 | Keisling | H05K 7/20609 |
| | | | 361/679.53 |
| 2015/0230366 A1* | 8/2015 | Shedd | H05K 7/20818 |
| | | | 165/84 |
| 2016/0073555 A1* | 3/2016 | Shrivastava | H05K 7/20709 |
| | | | 361/679.46 |
| 2016/0330873 A1* | 11/2016 | Farshchian | G06F 1/20 |
| 2017/0325354 A1* | 11/2017 | Lee | H05K 7/18 |
| 2018/0042140 A1* | 2/2018 | Pan | H05K 7/20736 |
| 2018/0192539 A1* | 7/2018 | Sakalkar | H05K 7/1492 |

\* cited by examiner

SERVER RACK INTEGRATED WITH COLD AIR DELIVERY

TECHNICAL FIELD

The present disclosure relates generally to server racks that are integrated with cold air delivery.

BACKGROUND

A data center is a facility that holds telecommunication equipment, e.g., computers, servers, telecommunication devices, storage systems, security devices, and power supplies. A data center can occupy a room, a floor, or even an entire building. Usually, most of the equipment in a data center includes servers that are placed in racks. People can access the servers between the racks. In the data center, operation of the servers generates heat. In order to cool the servers, various air cooling systems are used. However, the air cooling systems consume a great amount of power.

It is in this context that various embodiments of the present invention arise.

SUMMARY

The following detailed description together with the accompanying drawings will provide a better understanding of the nature and advantages of various embodiments of the present invention.

In some embodiments, a server rack that utilizes a hollow space inside a tube of the server rack to deliver cold air to a server placed within the server rack is described. A volume of the cold air that is moved within the hollow space is very small compared to that of a raised floor plenum, which is further described below. Therefore, fan power that is used to move the cold air within the hollow space is less compared to that used to pressurize the raised floor plenum. Moreover, the server rack having the hollow space does not need a raised floor plenum delivery system, which is expensive and difficult to implement.

In various embodiments, the hollow space of the server rack also delivers cold air directly to, such as in a direction directed towards, the server. This improves efficiency in cooling the server compared to cooling the entire server rack using the raised floor plenum.

In some embodiments, the tube of the server rack has multiple nozzles and a volume of air that is delivered to the server is adjusted by adjusting an amount by which an outlet of each nozzle is open or closed.

In various embodiments, multiple server racks are interconnected with each other and therefore, are scalable. For example, a rack-to-rack connector is used to connect the server racks with each other to deliver air from one of the server racks to another one of the server racks.

In several embodiments, there is no need to use a separate tube system to deliver the cold air to the server. The server rack already includes the tube, which is the hollow space, and the hollow spaces are used to deliver the cold air.

Data center cooling uses energy equal to about 50% of server power consumption. Central processing units (CPUs) generate significant heat and air conditioning consumes a lot of fan energy to move hot air away from the CPUs. And the data center utilizes the raised floor plenum air delivery system. An example of a raised floor height is about 4 feet. The raised floor is elevated at the height with respect to an under floor and is above the under floor. The air delivery system has a large fan, such as a computer room air handler (CRAH), that pushes cold air to the raised floor plenum, which is a space between the raised floor and the under floor. Cold air within the raised floor plenum travails through perforated tiles to cool servers within server racks placed within an enclosure. To maintain enough air velocity to deliver the cold air via the perforated tiles to the servers, the raised floor plenum is pressurized. The large fan is used to maintain the pressure in the raised floor plenum. The large fan consumes a large amount of power. The tubes of the server racks confine air to a small volume and therefore air within the tubes does not need to be pressured. This alleviates a need for the large fan. Also, the server racks can be placed on a floor that is not raised and therefore complexity and costs associated with the raised floor is nonexistent.

In addition, each of the servers generates a different amount of heat and so pushing the cold air via the perforated tiles to in front of the server racks does not control the cold air that is delivered to each of the servers. In some embodiments, valves are placed along a server rack to cool each server individually. Such placement of the valves directs cold air towards the server instead of directing the air towards the entire server rack.

In some embodiments, a server rack having a hollow space within has multiple nozzles, which are used to adjust a volume of air delivered to multiple servers within the server rack. For example, an outlet of each valve of the server rack is completely open, partially open, closed, or partially closed to control an amount of air that is output from the outlet. By controlling the amount of air that is output from the outlet, an amount of air that is provided to the servers is adjusted to realize micro-cooling to achieve energy efficiency.

In various embodiments, nozzles are placed to cool each server individually to minimize cooling loss. If all servers within a server rack are cooled when cooling of one server is sufficient, there is wastage of resources, such as fan power. By cooling each server based on parameters associated with the server, the cooling loss is minimized.

DETAILED DESCRIPTION

The following example embodiments and their aspects are described and illustrated in conjunction with apparatuses, methods, and systems which are meant to be illustrative examples, not limiting in scope.

Figure 1A:
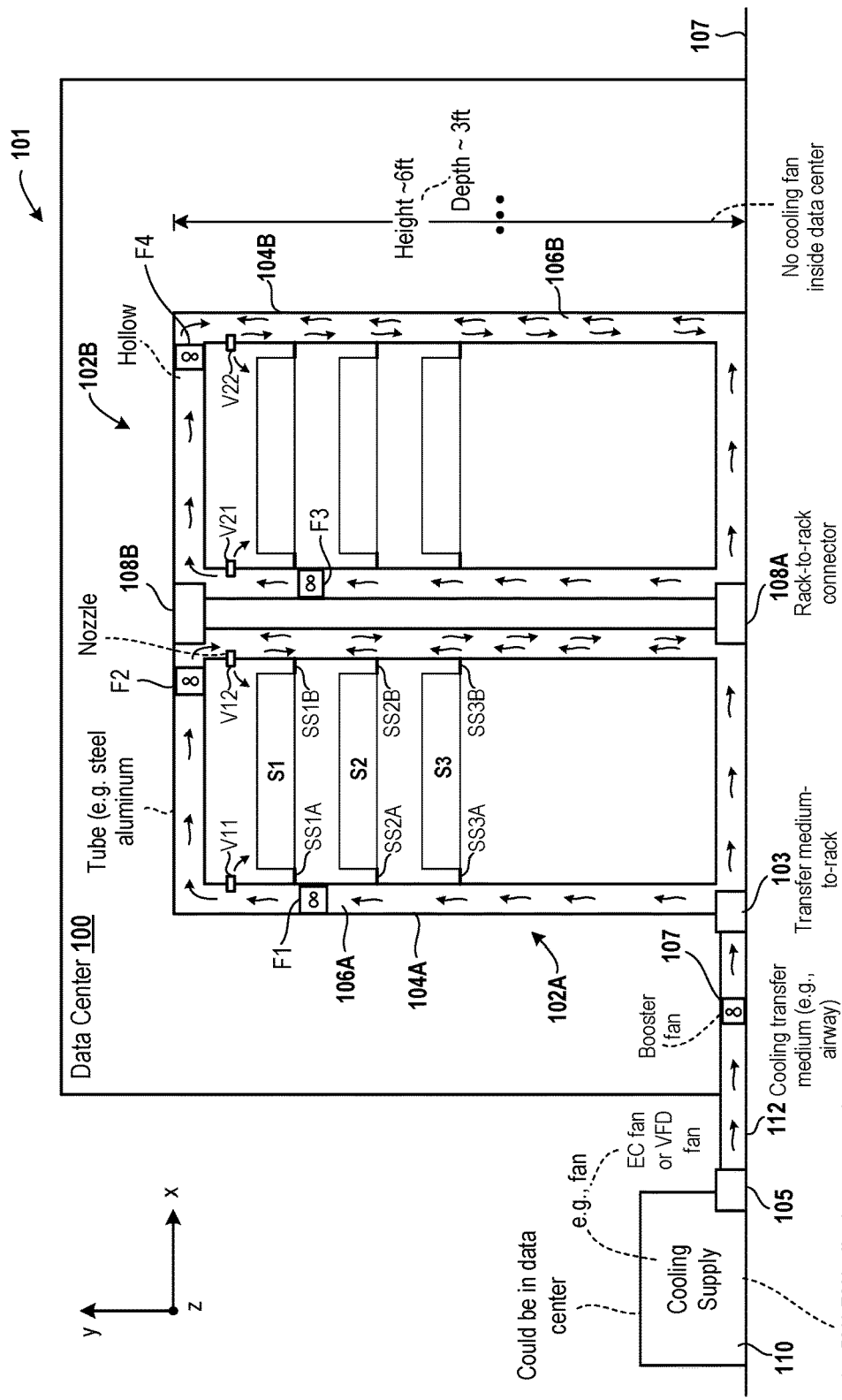
FIG. 1A is a diagram of an embodiment of a system for illustrating a data center having multiple server racks with tubular frames.

FIG. 1A is a diagram of an embodiment of a system 101 for illustrating a data center 100 having multiple server racks with tubular frames. The system 101 includes the data center 100, a cooling supply 110, and a cooling transfer medium 112. An example of the cooling supply 110 includes a fan that is 50% to 70% more efficient compared to a large fan that is used to supply cold air to a plenum under a data center. To illustrate, the fan of the cooling supply 110 is an electronically communicated (EC) fan or a variable frequency drive (VFP) fan. As another illustration, the fan of the cooling supply 110 uses 50% to 70% less energy than the large fan. The fan of the cooling supply 110 is operated continuously or intermittently. When the fan of the cooling supply 110 is operated intermittently, the fan is turned on and off at a predetermined frequency. Another example of the cooling supply 110 is an air compressor that generates compressed air. The air compressor is a device that converts power using an electric motor, diesel or gasoline engine, etc., into potential energy stored in pressurized air, e.g., compressed air. By one of several methods, the air compressor forces more and more air into a storage tank, increasing the pressure. When tank pressure reaches its upper limit the air compressor shuts off. The compressed air, then, is held in the tank until called into use. Yet another example of the cooling supply is an air compressor that generates compressed air and the compressed air is propagated from the fan of the cooling supply 110 to the cooling transfer medium 112. The fan of the cooling supply 110, in this example, is placed adjacent to the air compressor. Another example of the cooling supply 110 is a nitrogen generator that generates nitrogen for supplying the nitrogen via the cooling transfer medium 112 and a transfer medium-to-rack connector 103 to the server racks 102A and 102B and any other server racks, described herein. Air, compressed air, or nitrogen is sometimes referred to herein as a cooling gas.

An example of the cooling transfer medium 112 is an airway that is enclosed by a cooling tube. The cooling tube has the airway, which is a hollow space within the cooling tube to allow a transfer of air from the cooling supply 110 to a server rack 102A of the data center 100. The cooling tube has a cross-section, in a horizontal direction, of any shape, such as a square shape, a round shape, an elliptical shape, or a polygon shape. As an example, the cooling tube is made from metal or plastic. Examples of a metal, as used herein, include steel and aluminum.

The cooling transfer medium 112 is coupled via the transfer medium-to-rack connector 103 to the server rack 102A. The transfer medium-to-rack connector 103 has a cross-section, in the horizontal direction, of any shape, such as a square shape, a round shape, an elliptical shape, or a polygon shape. As an example, the transfer medium-to-rack connector 103 is made from metal or plastic.

Similarly, the cooling transfer medium 112 is coupled to the cooling supply 110 via a cooling supply-to-cooling transfer medium connector 105. The cooling supply-to-cooling transfer medium connector 105 has a cross-section, in the horizontal direction, of any shape, such as a square shape, a round shape, an elliptical shape, or a polygon shape. As an example, the cooling supply-to-cooling transfer medium connector 105 is made from metal or plastic.

The data center 100 includes the server rack 102A and a server rack 102B. The server racks 102A and 102B and the cooling supply 110 are placed on top of a floor 107. As an example, there is no plenum under the floor 107 to allow passage of air from a space above the floor 107 to the plenum and back via perforated tiles to the server racks 102A and 102B for cooling servers in a data center, described herein. The floor 107 is not raised above another floor.

A height of each server rack, described herein, is approximately 6 feet, such as ranges between 5 feet and 7 feet. The height is measured along a y-axis. The y-axis is substantially perpendicular to an x-axis. For example, the y-axis forms an angle ranging from and including about 85 degrees to about 95 degrees with respect to the x-axis. Moreover, a depth of each server rack, described herein, is approximately 3 feet, such as ranges between 2.5 feet and 3.5 feet. The depth is measured along a z-axis. The server rack 102A has a tubular frame 104A that has a hollow space 106A. Similarly, the server rack 102B has a tubular frame 104B that has a hollow space 106B. Each connector, transfer medium, and frame, described herein, is made up of a material, such as metal or plastic. It should be noted that each tubular frame, described herein, has a hollow space that is surrounded by a housing of the tubular frame. The hollow space allows and maintains a flow of air.

The tubular frame 104A is connected to the cooling transfer medium 112 via the transfer medium-to-rack connector 103. Moreover, the server rack 102A is connected to the server rack 102B via a rack-to-rack connector 108A and another rack-to-rack connector 108B. An example of a rack-to-rack connector include a tubular structure, which has a cross-section in the horizontal direction, of a shape, such as circular, oval, polygonal, rectangular, or square, etc. To illustrate, a rack-to-rack connector is made from a metal or from plastic.

Each server rack 102A and 102B has multiple support structures to support multiple servers. An example of the support structure of a tubular frame is a metal or a plastic bar that is connected to vertically oriented mounts of the tubular frame. The mounts are vertically oriented when they are aligned in a vertical direction, such as a direction of the y-axis. Another example of the support structure includes a bar having a slot for receiving a corresponding sliding bar that is fitted to a server. The server rack 102A is fitted with support structures SS1A, SS1B, SS2A, SS2B, SS3A, and SS3B. Similarly, the server rack 102B is fitted with multiple support structures.

Each set of support structures of a server rack supports a server of the server rack. For example, a set that has the support structures SS1A and SS1B supports a server S1. Moreover, a set that has the support structures SS2A and SS2B supports a server S2. Also, a set having the support structures SS3A and SS3B supports a server S3. Each set of support structures is horizontally aligned. For example, the support structure SS1A is aligned in the horizontal direction, such as a direction of the x-axis, with the support structure SS1B.

Each server rack is fitted with or integrated with one or more valves. For example, the tubular frame 104A is connected to or has a built-in valve V11 and is connected to or has a built-in valve V12. Similarly, the tubular frame 104B is connected to or has a built-in valve V21 and is connected to or has a built-in valve V22. To illustrate, a valve is fitted to a server rack by being connected via a fitting mechanism, such as screws or bolts and nuts or glue or other fasteners, or a combination thereof, to the server rack. As another illustration, the valve is fitted to the server rack such that the valve can be removed from a tubular frame of the server rack without damaging the server rack. As another illustration, a valve is integrated with a server rack when a housing of the valve is contiguous with a tubular frame of the server rack. For example, when the valve is integrated with the server rack, it is difficult to remove the valve without damaging a tubular frame of the server rack.

The valves V11 and V12 are located between a top portion 122 (FIG. 1B) of the tubular frame 104A and the set of support structures SS1A and SS2A. Similarly, the valves V21 and V22 are located between a top portion of the tubular frame 104B and a set of support structures of the server rack 102B that is closest to the top portion amongst all support structures of the server rack 102B. Examples of a valve, as used herein include a solenoid valve, a gate valve, a nozzle, a ball valve, a diaphragm valve, a globe valve, and a butterfly valve. In some embodiments, a valve is a device that has an opening or an outlet that can be opened to allow a passage of air or can be closed to disallow the passage of air.

Each tubular frame has enclosed therein one or more booster fans to increase a pressure or speed of flow of air that is within a hollow space of the tubular frame. For example, the tubular frame 104A has multiple booster fans F1 and F2 for enhancing a pressure or speed of air flow within the hollow space 106A. For example, air flows from the booster fan F2 via a space within the tubular frame 104A and the valve V12 to a space between the support structure SS1B and the top portion 122 (FIG. 1B) of the server rack 102A. As another example, air flows from the booster fan F1 via a space within the tubular frame 104A and the valve V11 to a space between the support structure SS1A and the top portion 122 of the server rack 102A. Similarly, the tubular frame 104B has multiple booster fans F3 and F4 to increase a pressure or speed of air flowing within the hollow space 106B. A booster fan is sized to fit within a hollow space of a tubular frame of a server rack. Moreover, the cooling transfer medium 112 has one or more booster fans, such as a booster fan 107, that are enclosed in a hollow space of the cooling transfer medium 112 to increase air pressure or speed of air within the hollow space.

The cooling supply 110 provides air, such as directs a flow of air, or generates compressed air, or increases a flow of air, towards the cooling transfer medium 112 via the cooling supply-to-cooling transfer medium connector 105. The air flows through the cooling transfer medium 112 towards the transfer medium-to-rack connector 103. A rate of flow of air through the cooling transfer medium 112 towards the transfer medium-to-rack connector 103 is increased by the booster fan 107.

The air is propagated via the transfer medium-to-rack connector 103 and is split between a portion of the hollow space 106A within a vertically oriented mount of the tubular frame 104A and a portion of the hollow space 106A within a horizontally oriented post of the tubular frame 104A. The air then spreads to the remaining vertically oriented mounts and horizontally oriented posts of the tubular frame 104A.

When the air reaches the valve V11 and the valve V11 is open, such as completely open or partially open, the air is directed towards a space 120 (FIG. 1B) between the vertically oriented mounts and between the horizontally oriented posts of the tubular frame 104A. Similarly, when the air reaches the valve V12 and the valve V12 is open, such as completely open or partially open, the air is directed towards the space 120. On the other hand, when the air reaches the valve V11 and the valve V11 is closed, such as completely or partially closed, the air is further directed via the horizontally oriented post of the tubular frame 104A towards the valve V12. A rate of flow of the air in the horizontally oriented post in the top portion 122 (FIG. 1B) of the tubular frame 104A is increased by the booster fan F1 so that the air flows faster from the valve V11 to the valve V12.

The air that flows in the hollow space 106A of the tubular frame 104A is directed to the rack-to-rack connector 108A and to the rack-to-rack connector 108B. The air flows from the hollow space 106A via the rack-to-rack connectors 108A and 108B to the hollow space 106B of the tubular frame 104B of the server rack 102B. The air is directed via the hollow space 106B towards the valves V21 and V22 of the server rack 102B.

When the air reaches the valve V21 and the valve V21 is open, such as completely or partially open, the air is directed towards a space, such as the space 120, between vertically oriented mounts and between the horizontally oriented posts of the tubular frame 104B. Similarly, when the air reaches the valve V22 and the valve V22 is open, such as completely or partially open, the air is directed towards the space between vertically oriented mounts and between the horizontally oriented posts of the tubular frame 104B. On the other hand, when the air reaches the valve V21 and the valve V21 is closed, such as completely or partially closed, the air is further directed via the horizontally oriented post of the tubular frame 104B towards the valve V22. A rate of flow of the air in the horizontally oriented post in the top portion 122 of the tubular frame 104B is increased by the booster fan F3 so that the air flows faster from the valve V21 to the valve V22.

In some embodiments, the data center 100 includes any number of server racks, such as 10, 20, 30 or 40 server racks in a row. The server racks are connected with each other via rack-to-rack connectors are have hollow spaces within tubular frames of the server racks.

In various embodiments, the server rack 102A is connected to the server rack 102B via any other number, such as one, three, four, or five, of rack-two-rack connectors.

In some embodiments, a server rack, described herein, is fitted with or integrated with any number of valves.

In various embodiments, in addition to or instead of the valves V11 and V12, a set of valves is located between a bottom portion 124 (FIG. 1B) of the tubular frame 104A and a set of support structures that is closest to the bottom portion 124 amongst all support structures of the server rack 102A.

In several embodiments, a server rack does not have a booster fan.

In various embodiments, the server rack has any number of booster fans, such as three or four or five, within a hollow space of the server rack.

In some embodiments, the cooling transfer medium 112 does not have a booster fan enclosed therein.

In various embodiments, a connector, such as the transfer medium-to-rack connector 103, the cooling supply-to-cooling transfer medium connector 105, or a rack-to-rack connector, described herein has one or more booster fans to boost an amount of flow of air that is passing through the connector.

In some embodiments, the cooling supply 110 is located in a room that is separate from a room in which the server racks, described herein, are located. This reduces noise of a fan of the cooling supply 110 compared to when both the cooling supply 110 and the server racks are located in the same room.

Figure 1B:
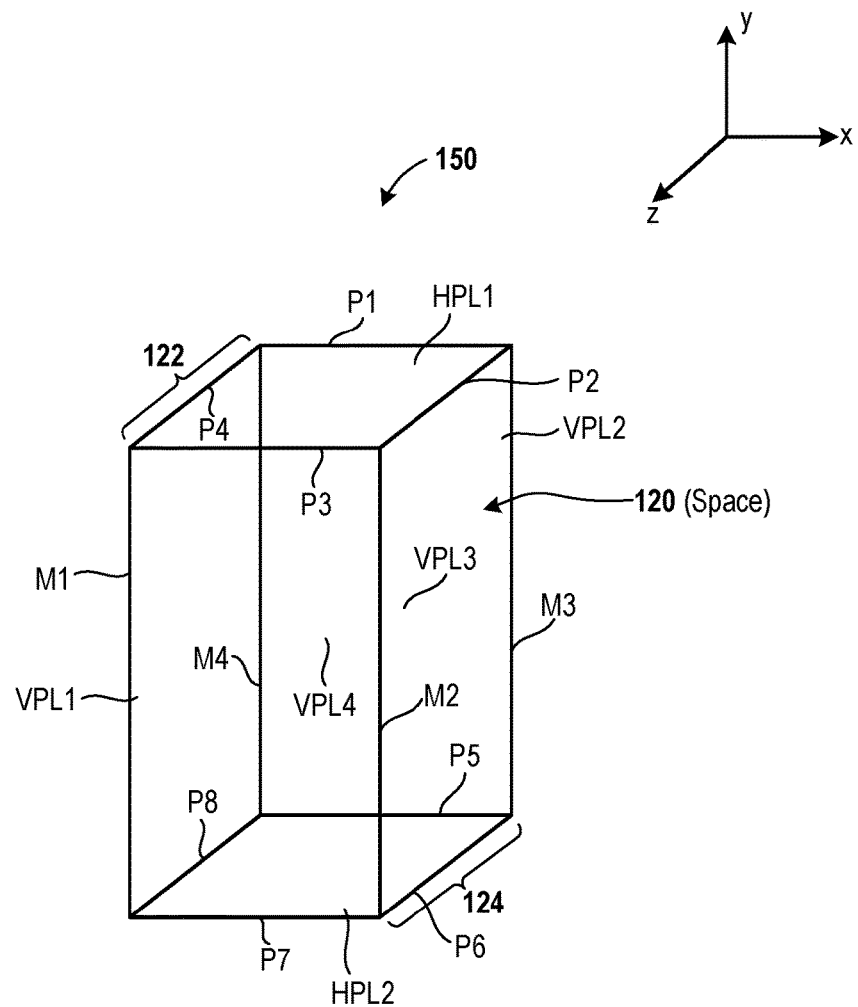
FIG. 1B is an isometric view of an embodiment of a server rack.

FIG. 1B is an isometric view of an embodiment of a server rack 200. Each server rack 102A and 102B (FIG. 1A) is an example of the server rack 200. The server rack 150 has the top portion 122, the bottom portion 124, and multiple vertically oriented mounts M1, M2, M3, and M4. Each of the top portion 122, the bottom portion 124, and multiple vertically oriented mounts M1, M2, M3, and M4 is a part of a tubular frame of the server rack 200. Multiple horizontally oriented posts P1, P2, P3, and P4 are parts of the top portion 122 and the horizontally oriented posts P5, P6, P7, and P8 are parts of the bottom portion 124. The horizontally oriented posts P1 through P4 lies within the same horizontally oriented plane HPL1 and the horizontally oriented posts P5 through P8 lie within the same horizontally oriented plane HPL2.

Moreover, the vertically oriented mounts M1 and M4 lie within the same vertically oriented plane VPL1. Also, the vertically oriented mounts M1 and M2 lie within the same vertically oriented plane VPL4. Moreover, the vertically oriented mounts M3 and M4 lie within the same vertically oriented plane VPL3 and the vertically oriented mounts M2 and M3 lie within the same vertically oriented plane VPL2. The vertically oriented mount M2 is diagonally situated with respect to the vertically oriented mount M4 and the vertically oriented mount M1 is diagonally situated with respect to the vertically oriented mount M3.

Furthermore, the horizontally oriented post P1 is aligned in the horizontal direction with respect to, such as substantially parallel to, the horizontally oriented post P3 and the horizontally oriented post P2 is aligned in the horizontal direction with respect to, such as substantially parallel to, the horizontally oriented post P4. Similarly, the horizontally oriented post P6 is aligned in the horizontal direction with respect to, such as substantially parallel to, the horizontally oriented post P8 and the horizontally oriented post P5 is aligned in the horizontal direction with respect to, such as substantially parallel to, the horizontally oriented post P7.

It should be noted that in some embodiments, vertically oriented means substantially parallel, such as parallel or forming an angle between about 0° and about 10° with respect to the y-axis. Similarly, horizontally oriented means substantially parallel, such as parallel or forming an angle between about 0° and about 10° with respect to the x-axis. The x-axis is perpendicular to the y-axis.

The space 120 is formed between the planes HPL1 and HPL2, is formed between the planes VPL1 and VPL3, and is formed between the planes VPL2 and VPL4. For example, the space 120 is formed between the vertically oriented mounts M2 and M4 and between the vertically oriented mounts M1 and M3. Similarly, the space 120 is formed the top portion 122 and the bottom portion 124.

In some embodiments, the support structures SS1A, SS2A, and SS3A are spaced apart in a substantially equal manner along a vertical direction of the y-axis along the mount M1 of FIG. 1B. For example, a distance in the vertical direction between the support structure SS1A and SS2A is approximately equal to, such as within a predetermined limit from, a distance in the vertical direction between the support structure SS2A and SS3A. Similarly, the support structures SS1B, SS2B, and SS3B are spaced apart in a substantially equal manner along a vertical direction of the y-axis along the mount M2 of FIG. 1B. For example, a distance in the vertical direction between the support structure SS1A and SS2A is approximately equal to, such as within a predetermined limit from, a distance in the vertical direction between the support structure SS2A and SS3A.

Figure 2:
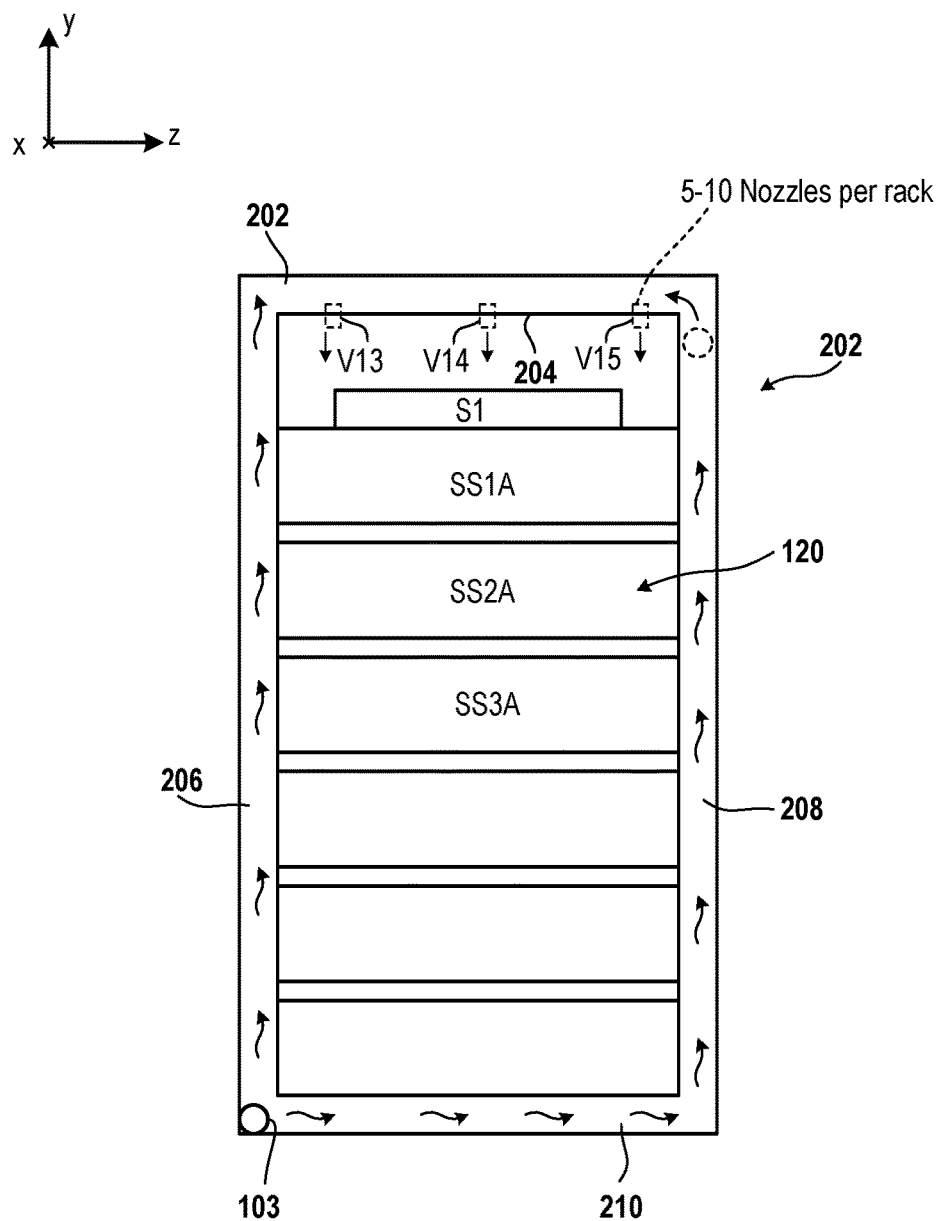
FIG. 2 is a side view of an embodiment of a server rack to illustrate multiple valves located along a depth of the server rack.

FIG. 2 is a side view of an embodiment of a server rack 200 to illustrate multiple valves V13, V14, and V15 located along a depth of the server rack 200. The server rack 200 is an example of the server rack 150 of FIG. 1B. The depth of the server rack 200 is along the z-axis. The z-axis is substantially perpendicular, such as forming an angle from and including about 85° to 95°, with respect to each of the x-axis and y-axis. As an example, the z-axis is perpendicular to the x-axis and is perpendicular to the y-axis.

The server rack 200 has a post 202, which is horizontally oriented. The post 202 is an example of the post P4. The server rack 200 has another post 210, which is an example of the post P8 of FIG. 1B. The post 210 is also horizontally oriented. The post 202 as a bottom surface 204, which faces the support structure SS1A located within the space 120. Each valve V13, V14, and V15 has an outlet, such as an opening, pointing towards the support structure SS1A.

The server rack 200 has a vertically oriented mount 206, which is an example of the mount M4 in FIG. 1B. The server rack 200 has another vertically oriented mount 208, which is an example of the mount M1 in FIG. 1B. As shown, air that is received by the cooling transfer medium 112 of FIG. 1A, flows via the transfer medium-to-rack connector 103 and an opening of the server rack 202 that interfaces with the transfer medium-to-rack connector 103, into a space within the mount 206. The air further flows in an upward direction, such as a direction of the y-axis, within the space within the mount 206 and further flows sideways, such as in the direction of the x-axis, via a space within the post 202. The air flows via the space within the post 202 and flows via the valves V13, V14, and V15 in a downward direction towards the support structure SS1A to cool the server S1 and other servers within the space 120. The downward direction is opposite to the upward direction.

In addition, the air flows via the transfer medium-to-rack connector 103 and the opening of the server rack 200 into a space within the post 210. The air flows sideways in the horizontal direction within the post 210 and then flows in the upward direction within the mount 208. The air further flows from the mount 208 into the post 202 sideways in the horizontal direction to flow via the valves V13, V14, and V15 in the downward direction towards the support structure SS1A to cool the server S1 and other servers within the space 120.

In some embodiments, valves, such as the valves V13, V14, and V15, are situated along the post P2 of FIG. 1B instead of or in addition to the valves V13 through V15 along the post 202.

In various embodiments, the transfer medium-to-rack connector 103 is situated at an intersection of the post 210 and the mount 208.

Although three valves are shown integrated with or fitted to, such as screwed with or welded to or glued to, the bottom surface 204, of the post 202, in some embodiments, the number of valves other than three, such as two, or five or ten, are integrated with or fitted to the bottom surface 204.

Figure 3:
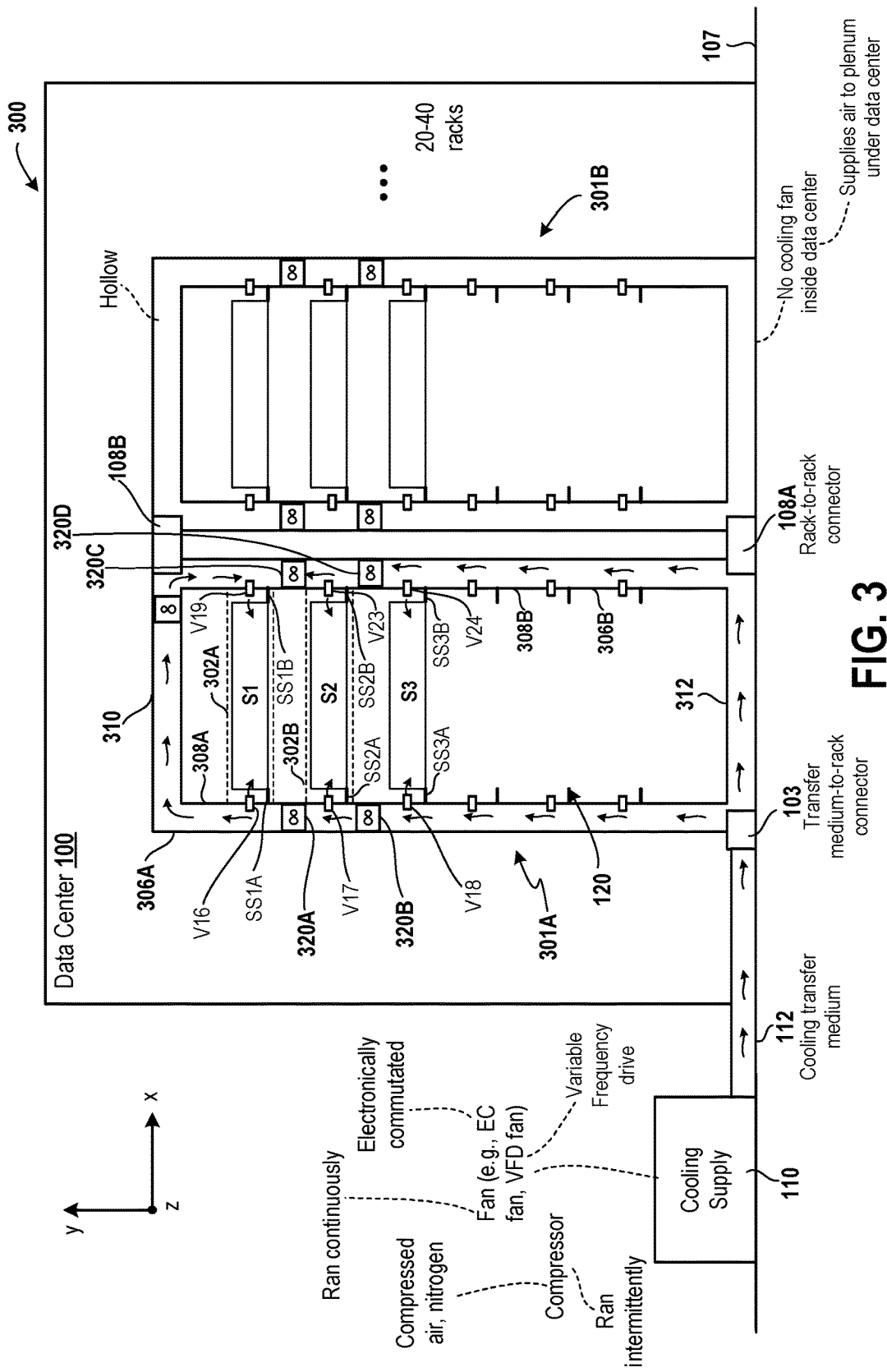
FIG. 3 is a diagram of an embodiment of a system to illustrate cooling of each server individually via valves of a server rack.

FIG. 3 is a diagram of an embodiment of a system 300 to illustrate cooling of each server S1 through S3 individually via valves V16, V17, V18, V19, V23, and V24. The system 300 is the same as the system 100 of FIG. 1A except that in the system 300, the fans F1, F2, F3, and F4 are not used. Moreover, in the system 300, the valves V16, V17, V18, V19, V23, and V24 are used instead of the valves V11 and V12 to cool each server S1 through S3 separately. The system 300 includes the data center 100. The data center 100 has multiple server racks 301A and 301B. The server rack 301A is connected to the cooling transfer medium 112 via the connector 103 in the same manner in which the server rack 102A of FIG. 1A is connected to the cooling transfer medium 112 of FIG. 1A. Moreover, the server rack 301A is connected to the server rack 301B in the same manner in which the server rack 102A is connected to the server rack 102B of FIG. 1A.

The server rack 301A has a mount 306A, which is an example of the mount M1 of FIG. 1B. Moreover, the server rack 304 has another mount 306B which is an example of the mount M2 of FIG. 1B. The valves V16, V17, and V18 are integrated with or fitted with, such as attached to, welded to, glued to, or screwed to, an inner surface 308A of the mount 306A. The inner surface 308A is adjacent to and in contact with the support structures SS1A, SS2A, and SS3A. For example, the support structures SS1A, SS12A, and SS3A are integrated with or attached to, such as welded to, glued to, or screwed to, to the inner surface 308A. As another example, the inner surface 308A faces the space 120.

Similarly, the valves V19, V23, and V24 are integrated with or fitted with, such as attached to, welded to, glued to, or screwed to, an inner surface 308B of the mount 306B. The inner surface 308B is adjacent to and in contact with the support structures SS1B, SS2B, and SS3B. For example, the support structures SS1B, SS2B, and SS3B are integrated with or attached to, such as welded to, glued to, or screwed to, to the inner surface 308B. As another example, the inner surface 308B faces the space 120.

The server rack 301A has a horizontally oriented post 310, which is an example of post P3 of FIG. 1B. The post 310 is integrated with and located between the mounts 306A and 306B.

The valve V16 is integrated with or fitted with the inner surface 308A and is located between the post 310 and the support structure SS1A. Similarly, the valve V19 is integrated with or fitted with the inner surface 308B and is located between the post 310 and the support structure SS1B. Moreover, the valve V17 is integrated with or fitted with, such as welded to, attached to, glued to, or screwed to, the inner surface 308A and is located between the support structure SS1A and the support structure SS2A. Similarly, the valve V23 is integrated with or fitted with the inner surface 308B and is located between the support structure SS1B and the support structure SS2B. Also, the valve V18 is integrated with or fitted with the inner surface 308A between the support structure SS12A and the support structure SS3A. Similarly, the valve V24 is integrated with or fitted with the inner surface 308B and is situated between the support structure SS2B and the support structure SS3B.

Moreover, the server rack 301A has a post 312, which is horizontally oriented. The post 312 is an example of the post P7 of FIG. 1B. The post 312 is integrated with and located between the mounts 306A and 306B.

Air received from the cooling supply 110 via the cooling transfer medium 112 and the connector 103 is transferred in the upward direction via a space within the mount 306A towards the valves V16-V18. Air is provided via an outlet of the valve V18 towards a space between the support structures SS3A and SS3B to cool the server S3 Similarly, air is provided via an outlet of the valve V17 towards a space 302B between the support structures SS2A and SS2B to cool the server S2. As an example, the space 302B is located between a set of the support structures SS2A and SS2B and a set of the support structures SS1A and SS1B. As another example, the space 302B includes the server S2 and surrounds the server S2. Also, air is provided via an outlet of the valve V16 towards a space 302A between the support structures SS1A and SS1B to cool the server S1. As an example, the space 302A is located between a set of the support structures SS1A and SS2A and the post 310. As another example, the space 302A includes the server S1 and surrounds the server S1.

In addition, air flows from the mount 306A towards the post 310 to flow in the horizontal direction in a space of the post 310 to reach the mount 306B. Air further flows in the downward direction via a space within the post 306B to reach the valves V19, V23, and V24. Air is provided via an outlet of the valve V19 towards the space 302A between the support structures SS1A and SS1B to cool the server S1. Similarly, air is provided via an outlet of the valve V23 towards the space 302B between the support structures SS2A and SS2B to cool the server S2. Moreover, air is provided via an outlet of the valve V24 towards the space between the support structures SS3A and SS3B to cool the server S3.

Furthermore, air received via the connector 103 flows in the horizontal direction via a space within the post 312 to the mount 306B. The air further flows in the upward direction via the space in the post 306B to reach the valves V19, V23, and V24.

Within the space of the mount 306A lies multiple booster fans 320A and 320B. For example, the booster fan 320A is fitted, such as attached to, glued to, welded to, or connected to, one or more inside surfaces of the mount 306A. To illustrate, a connector, such as a metal connector or a plastic connector, is connected to one or more inside surfaces of the mount 306A and another connector, such as a metal connector, is connected to a casing, such as a metal or a plastic housing, of the booster fan 320A. A fastener, such as a screw or a bolt and a nut, connects the connector connected to the one or more inside surfaces of the mount 306A with the casing.

The one or more inside surfaces of the mount 306A face the space within the mount 306A and does not face the space 120 between the mounts 306A and 306B. It should be noted that when a mount of the server rack 301A has a square cross-section in the vertical direction, the mount has multiple inside surfaces, such as four internal surfaces. Moreover, it should be noted that when a mount of the server rack 301A has a circular cross-section in the vertical direction, the mount has one inside surface. Similarly, the booster fan 320B is fitted within the space of the mount 306A. Moreover, similarly, the booster fans 320C and 320D are fitted within the space of the mount 306B.

In various embodiments, the system 300 excludes the booster fans.

In some embodiments, the system 300 includes any number of booster fans. For example, the server rack 150 of FIG. 1B includes one or more booster fans within the space of a post or a mount of the server rack 150.

Figure 4:
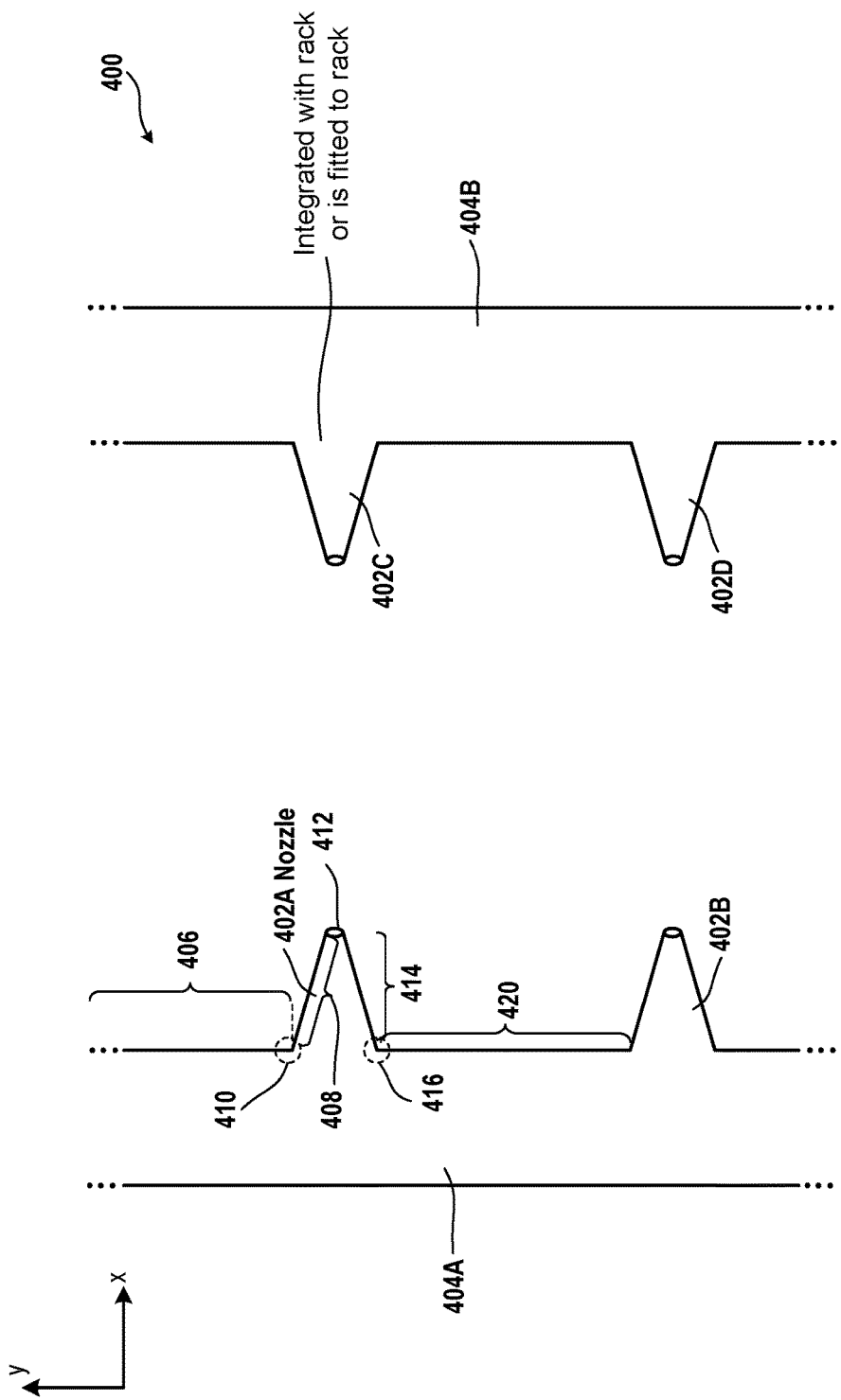
FIG. 4 is a diagram of an embodiment of a system to illustrate integration of a nozzle within a mount of a server rack.

FIG. 4 is a diagram of an embodiment of a system 400 to illustrate integration of a nozzle within a mount of a server rack. The system 400 includes a mount 404A, which is an example of the mount M1 or M4 of FIG. 1B. Moreover, the system 400 includes another mount 404B, which is an example of the mount M2 or M3 of FIG. 1B. Multiple nozzles 402A and 402B are integrated within the mount 404A. For example, at a time the mount 404A is fabricated, the nozzles 402A and 402B are fabricated as a part of the mount 404A. As another example, at a time a portion 406 of the mount 404A is manufactured, an angled surface 408 of the nozzle 402A of the mount 404A is fabricated. The portion 406 is a linear portion. The portion 406, which is aligned with the y-axis, in the vertical direction, is molded to form a curved portion 410 of the mount 404A. The curved portion 410 has a radius. The portion 408 of the mount 404A is fabricated. The portion 408 is angled with respect to the portion 406. For example, the portion 408 forms an angle ranging from and including about 90 degrees to about 120 degrees with respect to the portion 406. The portion 408 is linear. The portion 410 is contiguous, such as adjacent to or continuous with, with the portion 406 and the portion 408 is contiguous with the portion 410. An outlet 412, such as an opening, of the mount 404A is contiguous with the portion 408.

Another portion 414 of the mount 404A is contiguous with the outlet 412. The portion 414 is linear. Moreover, a curved portion 416 of the mount 404A is contiguous with the portion 414. The curved portion 416 has a radius. For example, the curved portion 416 has an arc. A linear portion 420, extending in the vertical direction, of the mount 404A is contiguous with the curved portion 416. Similarly, the nozzle 402B is integrated within the mount 404A. Moreover, in a similar manner, the nozzles 402C and 402D are integrated within the mount 404B.

In some embodiments, instead of being integrated within the mount 404A, the nozzles 402A and 402B are integrated within a post, such as the post P1, or the post P3, of the server rack 150 of FIG. 1B.

In various embodiments, in addition to the nozzles 402A and 402B being integrated within the mount 404A, one or more nozzles, such as the nozzle 402A or the nozzle 402B are integrated within a post, such as the post P1, or the post P3, of the server rack 150 of FIG. 1B.

In several embodiments, instead of being integrated to a post or a mount of the server rack 150, a nozzle is fitted, such as attached to, screwed to, welded to, or glued to, or a combination thereof, to one or more parts of a mount or a post of the server rack 150. Examples of the parts include the portions 406 and 420.

In several embodiments, the nozzle 402A is an example of the valve V16 or V17 of FIG. 3. Similarly, the nozzle 402B is an example of the valve V17 or V18 of FIG. 3. The nozzle 402C is an example of the valve V19 or V23 of FIG. 3. Similarly, the nozzle 402D is an example of the valve V23 or V24 of FIG. 3.

Figure 5A:
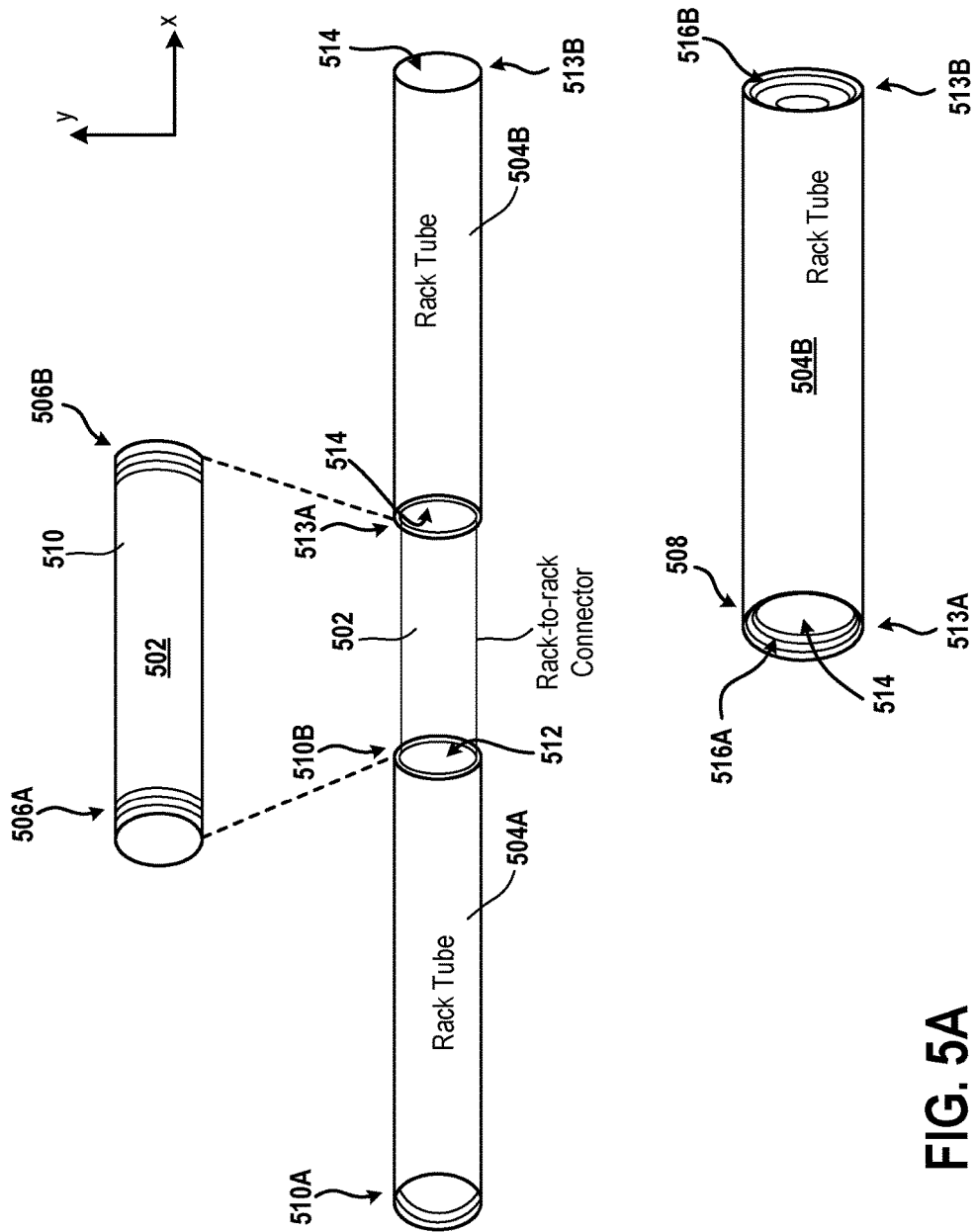
FIG. 5A is a diagram of an embodiment of a rack-to-rack tube that connects two rack tubes.

FIG. 5A is a diagram of an embodiment of a rack-to-rack tube 502 that connects two rack tubes 504A and 504B. The rack-to-rack tube 502 is an example of the rack-to-rack connector 108A or the rack-to-rack connector 108B (FIG. 1A). The rack tube 504A is an example of a post of a server rack, described herein, and the rack tube 504B is an example of a post of another server rack, described herein. As an example, the rack tube 504A is an example of a post of the server rack 102A (FIG. 1A) and the rack tube 504B is an example of a post of the server rack 102B (FIG. 1A). As another example, the rack tube 504A is an example of a post of the server rack 301A (FIG. 3) and the rack tube 504B is an example of a post of the server rack 301B (FIG. 3).

The rack-to-rack tube 502 has a thread 506A on its outer surface 510. Moreover, the rack-to-rack tube 502 has another thread 506B on the outer surface 510. The thread 506B is located on an opposite end of the outer surface 510 of the rack-to-rack tube 502 than an end of the outer surface 510 of the rack-to-rack tube 502 at which the thread 506B is located. The outer surface 510 does not face a space within the rack-to-rack tube 502.

The rack tube 504A has a thread on its inner surface 512 at an end 510B of the rack tube 504A and has a thread on the inner surface 512 at an end 510A of the rack tube 504A. The end 510B is located opposite to the end 510A. The inner surface 512 faces a space enclosed by the inner surface 512. Similarly, the rack tube 504B has a thread 516A on its inner surface 514 at an end 513A of the rack tube 504B. The inner surface 514 faces a space enclosed by the inner surface 514.

The thread on the inner surface 512 at the end 510B of the rack tube 504A couples, such as mates, with the thread 506A on the outer surface 510 of the rack-to-rack tube 502 to couple the rack-to-rack tube 502 with the rack tube 504A. For example, the rack tube 504A rotates in a clockwise direction to couple the thread on its inner surface 512 at the end 510B to the thread 506A.

Similarly, the thread 506B on the outer surface 510 of the rack-to-rack tube 502 couples with the thread 516A on the inner surface 514 of the rack tube 504B to couple the rack-to-rack tube 502 with the rack tube 504B. Also, the rack tube 504B has a thread 516B on its inner surface 514 at an end 513B to couple to a thread on an outer surface of another rack-to-rack connector to couple a post of another server rack with the server rack having the rack tube 504B. The end 513B is opposite to the end 513A.

In various embodiments, threads are on an outer surface of each rack tube 504A and 504B instead of on the inner surface of the rack tube. The outer surface of each rack tube 504A and 504B does not face the space within the rack tube. Moreover, threads are on an inner surface of the rack-to-rack tube 502 instead of on the outer surface 510. The inner surface of rack-to-rack tube 502 faces the space within the rack-to-rack tube 502. The thread on the outer surface of the rack tube 504A couple, such as mate, with the thread on the inner surface of the rack-to-rack tube 502 to couple the rack tube 504A with the rack-to-rack tube 502 at the end 510B of the rack tube 504A. Similarly, the thread on the outer surface of the rack tube 504B couple, such as mate, with the thread on the inner surface of the rack-to-rack tube 502 to couple the rack tube 504B with the rack-to-rack tube 502 at the end 513A of the rack tube 504B.

In some embodiments, each rack tube 504A and 504B and the rack-to-rack tube 502 has a cross-section in the horizontal direction other than a round shape. For example, each rack rube 504A and 504B has a square cross-section, a polygonal cross-section, or a rectangular cross-section. As another example, the rack-to-rack tube 502 has a square cross-section, a polygonal cross-section, or a rectangular cross-section. There are no threads on an outer surface of the rack-to-rack tube 502 and no threads on inner surfaces of the rack tubes 504A and 504B. A cross-sectional area of the rack-to-rack tube 502 in the horizontal direction is smaller than a cross-sectional area of each rack tube 504A and 504B to insert the rack-to-rack tube 502 into the rack tube 504A at one end of the rack-to-rack tube 502 and to insert the rack-to-rack tube 502 into the rack tube 504B at an opposite end of the rack-to-rack tube 502. In various embodiments, a cross-sectional area of the rack-to-rack tube 502 in the horizontal direction is larger than a cross-sectional area of each rack tube 504A and 504B to insert the rack tube 504A into the rack-to-rack tube 502 at one end of the rack-to-rack tube 502 and to insert the rack tube 504B into an opposite end of the rack-to-rack tube 502.

Figure 5B:
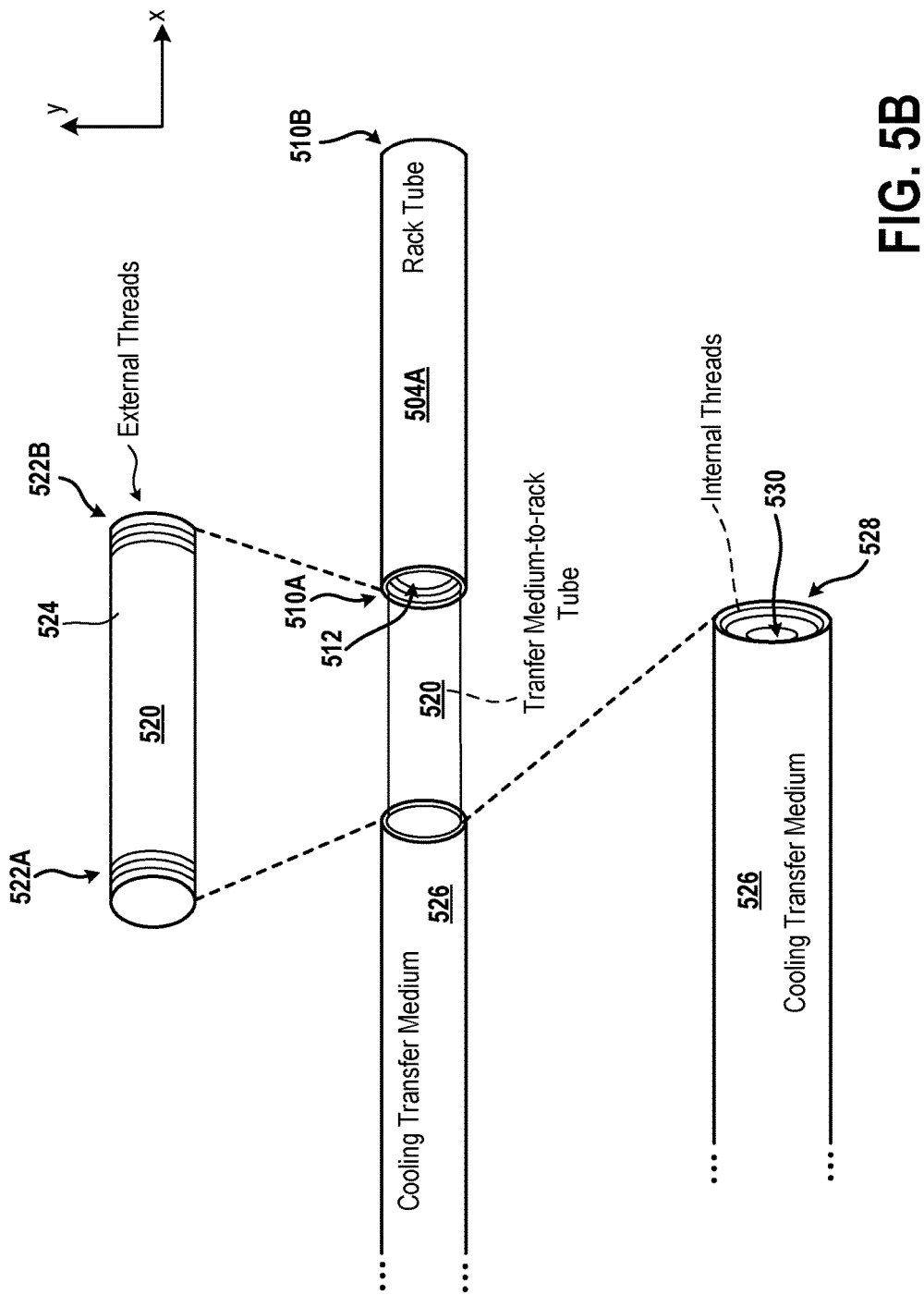
FIG. 5B is a diagram of an embodiment of a transfer medium-to-rack tube that connects a rack tube to a cooling transfer medium.

FIG. 5B is a diagram of an embodiment of a transfer medium-to-rack tube 520 that connects the rack tube 504A to the cooling transfer medium 526. The transfer medium-to-rack tube 520 is an example of the transfer medium-to-rack connector 103 (FIGS. 1A and 3). The cooling transfer medium 526 is an example of the cooling transfer medium 112 (FIGS. 1A and 3).

The transfer medium-to-rack tube 520 has a thread 522A on its outer surface 524. Moreover, the transfer medium-to-rack tube 520 has another thread 522B on the outer surface 524. The thread 522B is located on an opposite end of the outer surface 524 of the transfer medium-to-rack tube 520 compared to an end of the outer surface 524 of the transfer medium-to-rack tube 520. The outer surface 524 does not face a space within the transfer medium-to-rack tube 520.

The rack tube 504A has the thread at the end 510A on the inner surface 512. The thread on the inner surface 512 at the end 504A of the rack tube 504A couples, such as mates, with the thread 522B on the outer surface 524 of the transfer medium-to-rack tube 520 to couple the transfer medium-to-rack tube 520 with the rack tube 504A. For example, the rack tube 504A rotates in a clockwise direction to couple the thread on its inner surface to the thread 522B. Moreover, the thread 522A on the outer surface 524 of the transfer medium-to-rack tube 520 couples with a thread 528 on an inner surface 530 of the cooling transfer medium 526 to couple the transfer medium-to-rack tube 520 with the cooling transfer medium 526. The inner surface 530 faces a space within the cooling transfer medium 526.

In various embodiments, threads are on the outer surface of the rack tube 504A instead of on the inner surface of the rack tube 504A. Similarly, threads are on an outer surface of the cooling transfer medium 526 instead of on the inner surface of the cooling transfer medium 526. The outer surface of the cooling transfer medium 526 does not face the space within the cooling transfer medium 526. Moreover, threads are on an inner surface of the transfer medium-to-rack tube 520 instead of on the outer surface 524. The inner surface of transfer medium-to-rack tube 520 faces the space within the transfer medium-to-rack tube 520. The thread on the outer surface of the rack tube 504A couple, such as mate, with the thread on the inner surface of the transfer medium-to-rack tube 520 to couple the rack tube 504A with the transfer medium-to-rack tube 520 at the end 510A of the rack tube 504A. Similarly, the thread on the outer surface of the cooling transfer medium 526 couple, such as mate, with the thread on the inner surface of the transfer medium-to-rack tube 520 to couple the cooling transfer medium 526 with the transfer medium-to-rack tube 520 at the end 522A of the transfer medium-to-rack tube 520.

In some embodiments, the rack tube 504A, the cooling transfer medium 526, and the transfer medium-to-rack tube 520 has a cross-section in the horizontal direction other than a round shape. For example, each of the rack tube 504A, the cooling transfer medium 526, and the transfer medium-to-rack tube 520 has a square cross-section, a polygonal cross-section, or a rectangular cross-section. There are no threads on an outer surface of the transfer medium-to-rack tube 520 and no threads on inner surfaces of the rack tube 504A and the cooling transfer medium 526. A cross-sectional area of the transfer medium-to-rack tube 520 in the horizontal direction is smaller than a cross-sectional area of each of the rack tube 504A and the cooling transfer medium 526 to insert the transfer medium-to-rack tube 520 into the rack tube 504A at one end of the transfer medium-to-rack tube 520 and to insert the transfer medium-to-rack tube 520 into the cooling transfer medium 526 at an opposite end of the transfer medium-to-rack tube 520. In various embodiments, a cross-sectional area of the transfer medium-to-rack tube 520 in the horizontal direction is larger than a cross-sectional area of each of the rack tube 504A and the cooling transfer medium 526 to insert the rack tube 504A into the transfer medium-to-rack tube 520 at one end of the transfer medium-to-rack tube 520 and to insert the cooling transfer medium 526 into an opposite end of the transfer medium-to-rack tube 520.

Figure 6A:
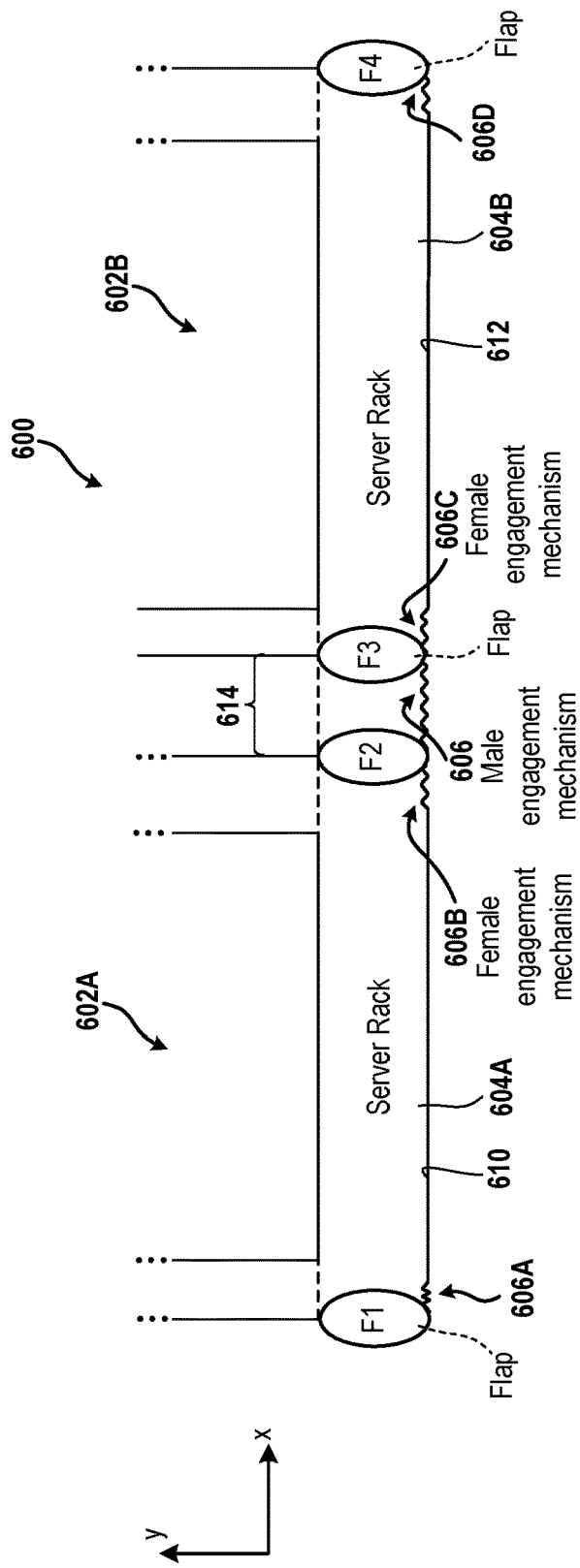
FIG. 6A is a diagram of an embodiment of a system to illustrate use of flap and engagement mechanisms to couple a server rack with another server rack.

FIG. 6A is a diagram of an embodiment of a system 600 to illustrate use of flap and engagement mechanisms to couple a server rack 602A with another server rack 602B. The server rack 602A is an example of the server rack 102A of FIG. 1A and the server rack 602B is an example of the server rack 102B of FIG. 1A. Similarly, the server rack 602A is an example of the server rack 301A of FIG. 3 and the server rack 602B is an example of the server rack 301B of FIG. 3.

A post 604A of the server rack 602A has a female engagement mechanism 606A on its internal surface 610 and another female engagement mechanism 606B on the internal surface 610. The internal surface 610 faces a space within the post 604A. Similarly, a post 604B of the server rack 602B has a female engagement mechanism 606C on its internal surface 612 and another female engagement mechanism 606D on the internal surface 612. The internal surface 612 faces a space within the post 604B. An example of each female engagement mechanism 606A through 606D is a ripped portion or wavy portion or ruffled portion of an internal surface of a post having the female engagement mechanism. To illustrate, each female engagement mechanism 606A through 606D is a series of troughs and peaks. To further illustrate, a peak precedes a trough, which precedes another peak.

The post 604A is an example of the post P7 or P5 or P3 or P1 of FIG. 1B. Similarly, the post 604B is an example of the post P7 or P5 or P3 or P1.

Also, an end of the post 604A has a flap F1 and an opposite end of the post 604A has another flap F2. A portion of the flap F1 is coupled to, such as glued to, screwed to, attached to, bolted to, or a combination thereof, or a combination thereof, to the internal surface 610. Similarly, a portion of the flap F2 is coupled to, such as glued to, screwed to, attached to, bolted to, or a combination thereof, or a combination thereof, to the internal surface 612. Each flap, described herein, is made from a flexible material, such as rubber or plastic. Similarly, an end of the post 604B has a flap F3 and an opposite end of the post 604B has another flap F4. A portion of the flap F3 is coupled to, such as glued to, screwed to, attached to, bolted to, or a combination thereof, or a combination thereof, to the internal surface 612. Similarly, a portion of the flap F4 is coupled to, such as glued to, screwed to, attached to, bolted to, or a combination thereof, or a combination thereof, to the internal surface 612.

Moreover, a rack-to-rack connector 614 has a male engagement mechanism 608 on its internal surface 616. The internal surface 616 faces a space within the rack-to-rack connector 614. The rack-to-rack connector 614 is an example of the rack-to-rack connector 108A of FIGS. 1A and 3. Moreover, the rack-to-rack connector 614 is an example of the rack-to-rack connector 108B of FIGS. 1A and 3. An example of the male engagement mechanism 608 is a ripped portion or wavy portion or ruffled portion of the internal surface 618 of the rack-to-rack connector 614. To illustrate, the male engagement mechanism 608 as a series of troughs and peaks. To further illustrate, a peak of the male engagement mechanism 608 precedes a trough of the male engagement mechanism 608 and the trough precedes another peak of the male engagement mechanism 608.

The rack-to-rack connector 614 has an outer diameter that is smaller than an outer diameter of each post 604A and 604B. The rack-to-rack connector 614 is inserted via the flap F2 into the post 604A to couple, such as engage, a portion of the male engagement mechanism 608 with the female engagement mechanism 606B to couple the rack-to-rack connector 614 with the server rack 602A. To illustrate, a trough of the male engagement mechanism 608 comes in contact with a peak of the female engagement mechanism 606B and a peak of the male engagement mechanism 608 comes in contact with a trough of the female engagement mechanism 606B. Similarly, the rack-to-rack connector 614 is inserted via the flap F3 into the post 604B to couple, such as engage, a portion of the male engagement mechanism 608 with the female engagement mechanism 606C to couple the rack-to-rack connector 614 with the server rack 602B. To illustrate, a trough of the male engagement mechanism 608 comes in contact with a peak of the female engagement mechanism 606C and a peak of the male engagement mechanism 608 comes in contact with a trough of the female engagement mechanism 606C. Each flap of a post or a rack-to-rack connector reduces chances of air from escaping outside a space within the post or the rack-to-rack connector.

In various embodiments, each of the post 604A, the rack-to-rack connector 614, and the post 604B has a cross-section in the horizontal direction other than a circular cross-section. For example, each of the post 604A, the rack-to-rack connector 614, and the post 604B has a polygonal cross-section, or a rectangular cross-section, or a square cross-section, or an oval cross-section.

In some embodiments, the system 600 excludes any flap.

Figure 6B:
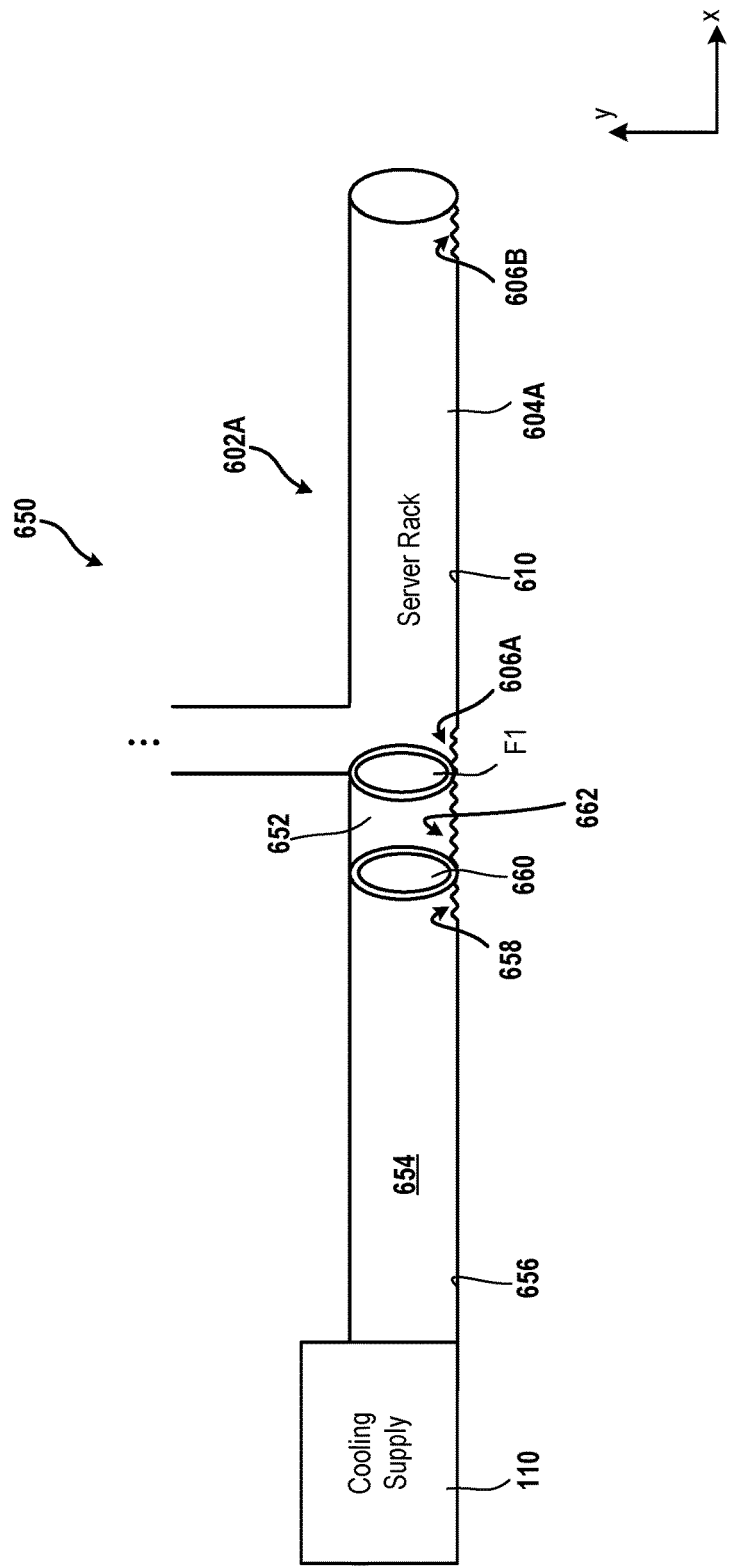
FIG. 6B is a diagram of an embodiment of a system to illustrate a coupling of a server rack with the cooling transfer medium.

FIG. 6B is a diagram of an embodiment of a system 650 to illustrate a coupling of the server rack 602A with a cooling transfer medium 654, which is an example of the cooling transfer medium 112 of FIGS. 1A and 3. The server rack 602A is connected to the cooling transfer medium 612 via a transfer medium-to-rack connector 652, which is an example of the transfer medium-to-rack connector 103 of FIGS. 1A and 3.

An internal surface 656 of the cooling transfer medium 654 has a female engagement mechanism 658, which is the same structure as that of the female engagement mechanism 606A. The internal surface 656 faces a space within the cooling transfer medium 654.

Moreover, an internal surface of the transfer medium-to-rack connector 652 has a male engagement mechanism 662. The internal surface of the transfer medium-to-rack connector 652 faces a space within a housing, such as a body, of the transfer medium-to-rack connector 652. The male engagement mechanism 662 is the same structure as that of the male engagement mechanism 608 of the rack-to-rack connector 614 of FIG. 6A. Moreover, a portion of a flap 660, which has the same structure as that of any of the flaps F1-F4 of FIG. 6A, is coupled with, such as attached to, glued to, screwed to, or a combination thereof, the internal surface 656 of the cooling transfer medium 654.

The transfer medium-to-rack connector 652 has an outer diameter that is smaller than an outer diameter of the post 604A and the cooling transfer medium 654. The transfer medium-to-rack connector 652 is inserted via the flap 660 into the space of the cooling transfer medium 654 to couple, such as engage, a portion of the male engagement mechanism 662 with the female engagement mechanism 658 to couple the transfer medium-to-rack connector 652 with the cooling transfer medium 654. To illustrate, a trough of the male engagement mechanism 662 comes in contact with a peak of the female engagement mechanism 658 and a peak of the male engagement mechanism 662 comes in contact with a trough of the female engagement mechanism 658. Similarly, the transfer medium-to-rack connector 652 is inserted via the flap F1 into the post 604A to couple, such as engage, a portion of the male engagement mechanism 662 with the female engagement mechanism 606A to couple the transfer medium-to-rack connector 652 with the server rack 602A. To illustrate, a trough of the male engagement mechanism 662 comes in contact with a peak of the female engagement mechanism 606A and a peak of the male engagement mechanism 662 comes in contact with a trough of the female engagement mechanism 606A. Each flap of a transfer medium-to-rack connector reduces chances of air from escaping outside a space within the transfer medium-to-rack connector.

In various embodiments, each of the post 604A and the transfer medium-to-rack connector 652 has a cross-section in the horizontal direction other than a circular cross-section. For example, each of the post 604A and the transfer medium-to-rack connector 652 has a polygonal cross-section, or a rectangular cross-section, or a square cross-section, or an oval cross-section.

In some embodiments, the system 650 excludes any flap.

Figure 7A:
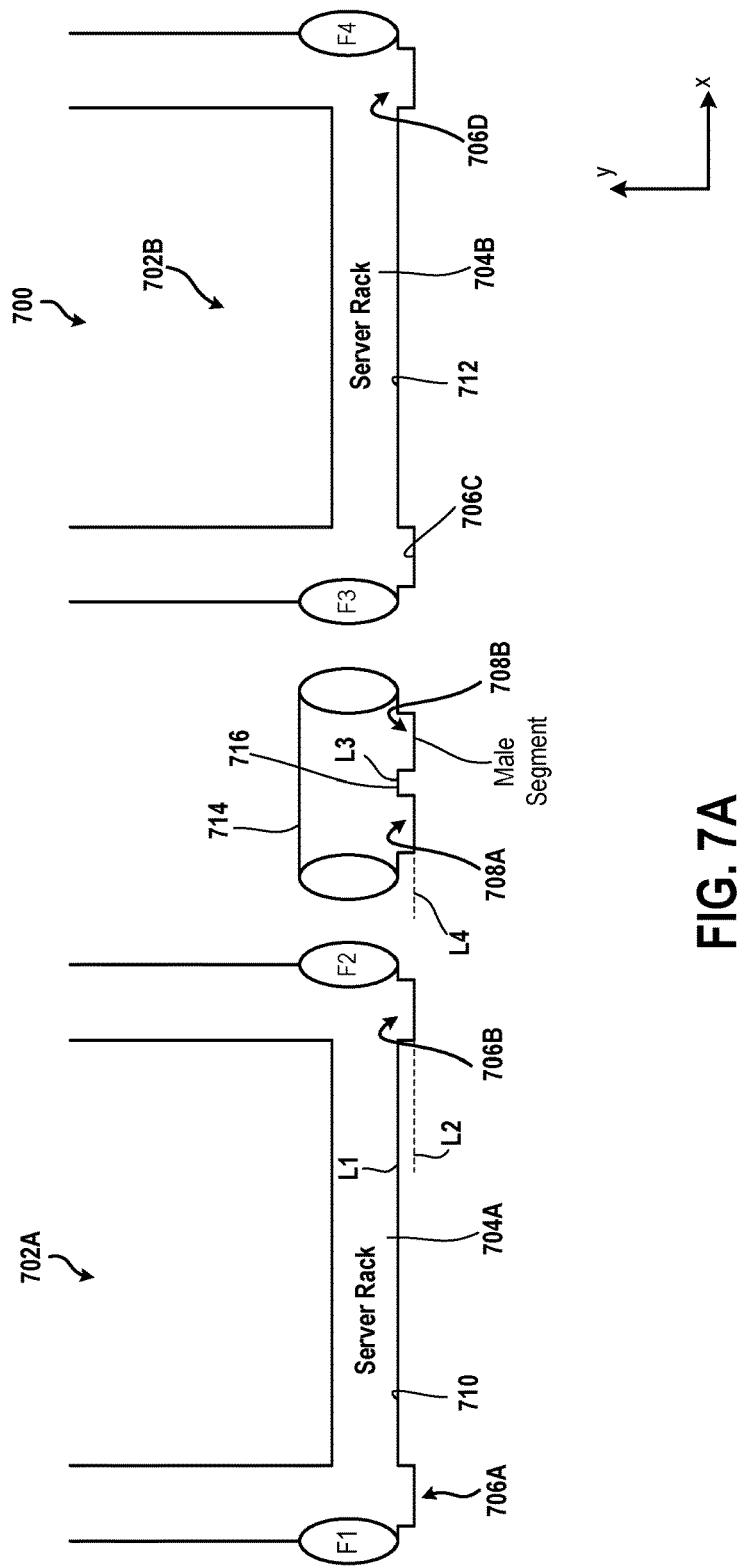
FIG. 7A is a diagram of an embodiment of a system to illustrate use of flap and engagement mechanisms to couple a server rack with another server rack.

FIG. 7A is a diagram of an embodiment of a system 700 to illustrate use of flap and engagement mechanisms to couple a server rack 702A with another server rack 702B. The server rack 702A is an example of the server rack 102A of FIG. 1A and the server rack 702B is an example of the server rack 102B of FIG. 1A. Similarly, the server rack 702A is an example of the server rack 301A of FIG. 3 and the server rack 702B is an example of the server rack 301B of FIG. 3.

A post 704A of the server rack 702A has a female engagement mechanism 706A on its internal surface 710 and another female engagement mechanism 706B on the internal surface 710. The internal surface 710 faces a space within the post 704A. Similarly, a post 704B of the server rack 702B has a female engagement mechanism 706C on its internal surface 712 and another female engagement mechanism 706D on the internal surface 712. The internal surface 712 faces a space within the post 704B. An example of each female engagement mechanism 706A through 706D is a slot fabricated within an internal surface of a post having the female engagement mechanism. To illustrate, each female engagement mechanism 706A and 706B is a recession with respect to a level L1, along the horizontal direction, of the internal surface 710. A lower surface of the recession has a recession level L2 that is below the level L1 of the internal surface 710.

The post 704A is an example of the post P7 or P5 or P3 or P1 of FIG. 1B. Similarly, the post 704B is an example of the post P7 or P5 or P3 or P1.

Also, an end of the post 704A has the flap F1 and an opposite end of the post 704A has the flap F2. A portion of the flap F1 is coupled to, such as glued to, screwed to, attached to, bolted to, or a combination thereof, or a combination thereof, to the internal surface 710. Similarly, a portion of the flap F2 is coupled to, such as glued to, screwed to, attached to, bolted to, or a combination thereof, or a combination thereof, to the internal surface 710. Each flap, described herein, is made from a flexible material, such as rubber or plastic.

Similarly, an end of the post 704B has the flap F3 and an opposite end of the post 704B has the flap F4. A portion of the flap F3 is coupled to, such as glued to, screwed to, attached to, bolted to, or a combination thereof, or a combination thereof, to the internal surface 712. Similarly, a portion of the flap F4 is coupled to, such as glued to, screwed to, attached to, bolted to, or a combination thereof, or a combination thereof, to the internal surface 712.

Moreover, a rack-to-rack connector 714 has multiple male engagement mechanisms 708A and 708B on its internal surface 716. Each male engagement mechanism 708A and 708B is a protrusion in the vertical direction with respect to a level L3 of the internal surface 716. Each male engagement mechanism 708A and 708B protrudes until a level L4, which is between the levels L1 and L2. Also, the level L3 is slightly above the level L1 in the vertical direction. The internal surface 716 faces a space within the rack-to-rack connector 714. The rack-to-rack connector 714 is an example of the rack-to-rack connector 108A of FIGS. 1A and 3. Moreover, the rack-to-rack connector 714 is another example of the rack-to-rack connector 108B of FIGS. 1A and 3.

The rack-to-rack connector 714 has an outer diameter that is smaller than an outer diameter of each post 704A and 704B. The rack-to-rack connector 714 is inserted via the flap F2 into the post 704A to couple, such as engage, the male engagement mechanism 708A with the female engagement mechanism 706B to couple the rack-to-rack connector 714 with the server rack 702A. To illustrate, the protrusion of the male engagement mechanism 708A comes in contact with a slot of the female engagement mechanism 706B. Similarly, the rack-to-rack connector 714 is inserted via the flap F3 into the post 704B to couple, such as engage, the male engagement mechanism 708B with the female engagement mechanism 706C to couple the rack-to-rack connector 714 with the server rack 702B. To illustrate, the protrusion of the male engagement mechanism 708B comes in contact with a slot of the female engagement mechanism 706C.

In various embodiments, each of the post 704A, the rack-to-rack connector 714, and the post 704B has a cross-section in the horizontal direction other than a circular cross-section. For example, each of the post 704A, the rack-to-rack connector 714, and the post 704B has a polygonal cross-section, or a rectangular cross-section, or a square cross-section, or an oval cross-section.

In some embodiments, the system 700 excludes any flap.

Figure 7B:
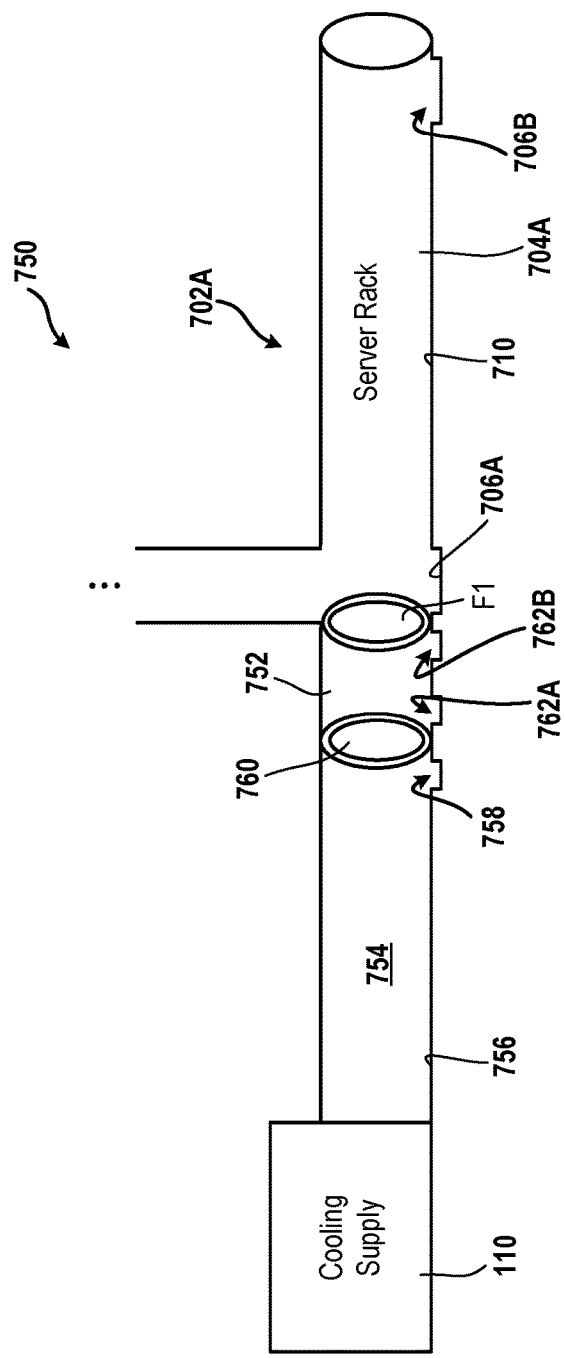
FIG. 7B is a diagram of an embodiment of a system to illustrate a coupling of a server rack with the cooling transfer medium.

FIG. 7B is a diagram of an embodiment of a system 752 illustrate a coupling of the server rack 702A with a cooling transfer medium 754, which is an example of the cooling transfer medium 112 of FIGS. 1A and 3. The server rack 702A is connected to the cooling transfer medium 712 via a transfer medium-to-rack connector 752, which is an example of the transfer medium-to-rack connector 103 of FIGS. 1A and 3.

An internal surface 756 of the cooling transfer medium 754 has a female engagement mechanism 758, which is the same structure as that of the female engagement mechanism 706A of FIG. 7A. The internal surface 756 faces a space within the cooling transfer medium 654.

Moreover, an internal surface of the transfer medium-to-rack connector 752 has multiple male engagement mechanisms 762A and 762B. The internal surface of the transfer medium-to-rack connector 752 faces a space within a housing, such as a body, of the transfer medium-to-rack connector 752. Each male engagement mechanism 762A and 762B has the same structure as that of the male engagement mechanism 708 of the rack-to-rack connector 714 of FIG. 7A. Moreover, a portion of a flap 760, which has the same structure as that of any of the flaps F1-F4 of FIG. 7A, is coupled with, such as attached to, glued to, screwed to, or a combination thereof, with the internal surface 756 of the cooling transfer medium 754.

The transfer medium-to-rack connector 752 has an outer diameter that is smaller than an outer diameter of the post 704A and the cooling transfer medium 754. The transfer medium-to-rack connector 752 is inserted via the flap 760 into the space of the cooling transfer medium 754 to couple, such as engage, a portion of the male engagement mechanism 762A with the female engagement mechanism 758 to couple the transfer medium-to-rack connector 752 with the cooling transfer medium 754. To illustrate, a protrusion of the male engagement mechanism 762 comes in contact with a recession, such as a slot, of the female engagement mechanism 758. Similarly, the transfer medium-to-rack connector 752 is inserted via the flap F1 into the post 704A to couple, such as engage, the male engagement mechanism 762B with the female engagement mechanism 706A to couple the transfer medium-to-rack connector 752 with the server rack 702A. To illustrate, a protrusion of the male engagement mechanism 762B comes in contact with a slot of the female engagement mechanism 706A.

In various embodiments, each of the post 704A and the transfer medium-to-rack connector 752 has a cross-section in the horizontal direction other than a circular cross-section. For example, each of the post 704A and the transfer medium-to-rack connector 752 has a polygonal cross-section, or a rectangular cross-section, or a square cross-section, or an oval cross-section.

In some embodiments, the system 750 excludes any flap.

Figure 8:
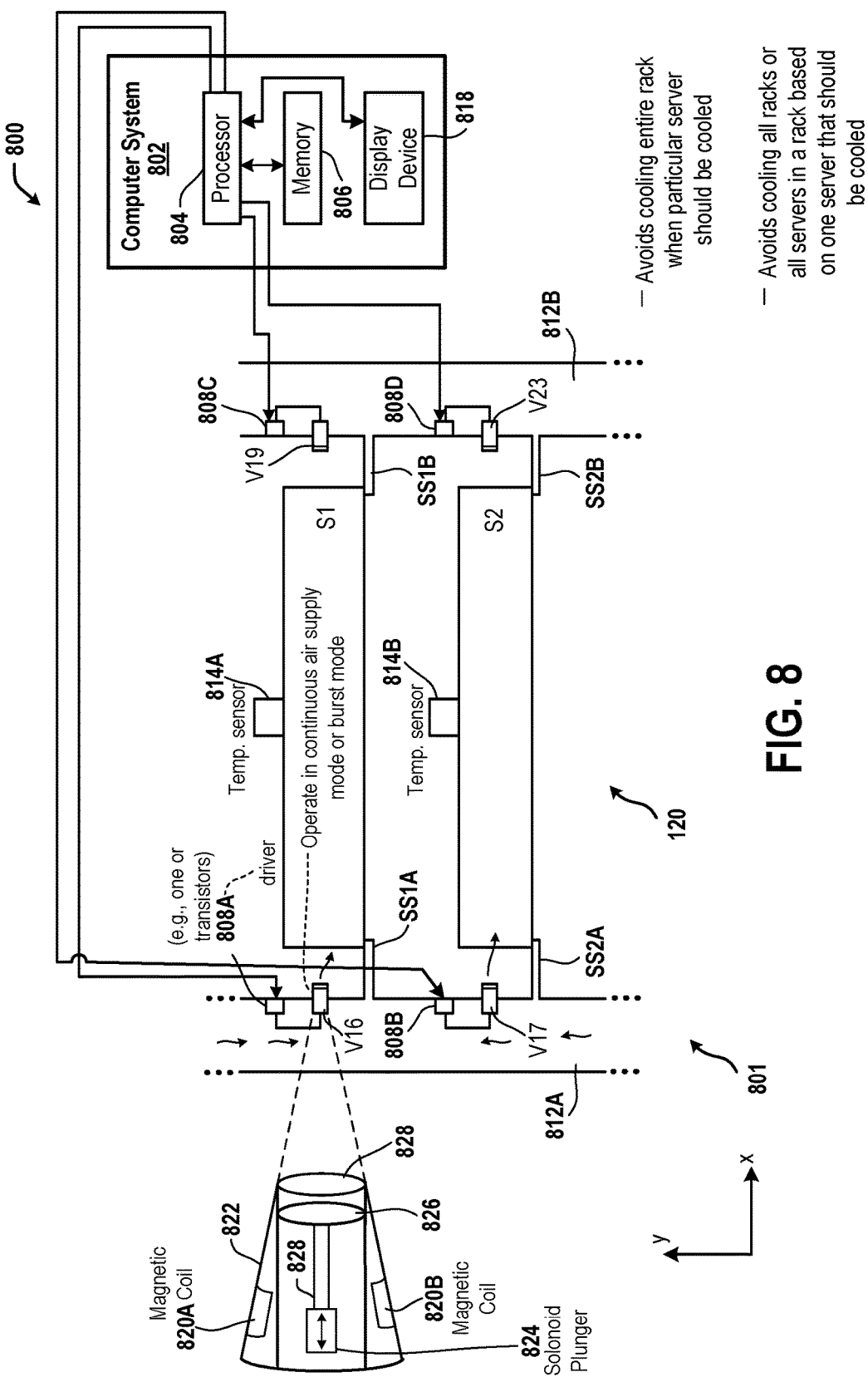
FIG. 8 is a diagram of an embodiment of a system to illustrate valves to control cooling of each server.

FIG. 8 is a diagram of an embodiment of a system 800 to illustrate valves to control cooling of each server S1 and S2. The system 800 includes a mount 812A and amount 812B of a server rack 801. Moreover, the system 800 includes a computer system 802, which further includes a processor 804, a memory device 806, and a display device 818. The processor 804 is coupled to the memory device 806. Examples of the processor 804 include an application-specific integrated circuit (ASIC), a programmable logic device (PLD), a microcontroller, a microprocessor, or any other integrated circuit. Examples of the memory device 806 include a read-only memory (ROM) and a random access memory (RAM). To illustrate, the memory device 806 is a hard disk or a flash memory. Examples of the display device 818 include a light emitting diode (LED) display for a liquid crystal display (LCD). The mount 812A is an example of mount M1 of FIG. 1B and mount 812B is an example of the mount M2 of FIG. 1B. The mount 812A is an example of mount 306A of FIG. 3 and mount 812B is an example of the mount 306B of FIG. 3.

The valve V16 and another valve V17 are mounted, such as fitted, to the mount 812A. Similarly, the valve V19 and another valve V23 are mounted, such as fitted, to the mount 812B.

A valve driver 808A is mounted, such as attached to, fitted to, screwed to, to an inside surface of the mount 812A. The inside surface of the mount 812A faces a space within a housing of the mount 812A. An example of a valve driver includes one or more transistors. The valve driver 808A is coupled to the valve V16. Similarly, another valve driver 808B is mounted to the inside surface of the mount 812A and is coupled to the valve V17.

Moreover, a valve driver 808C is mounted, such as attached to, fitted to, screwed to, to an inside surface of the mount 812B. The inside surface of the mount 812B faces a space within a housing of the mount 812B. The valve driver 808C is coupled to the valve V19. Similarly, another valve driver 808D is mounted to the inside surface of the mount 812B and is coupled to the valve V23.

Also, a temperature sensor 814A is coupled to, such as in contact with, the surface of the server S1, which is supported by the support structures SS1A and SS1B. The support structures SS1A and SS1B are integrated with or fitted to outside surfaces of the mounts 812A and 812B. The outside surfaces of the mounts 812A and 812B face the space 120 between mounts 812A and 812B.

Similarly, a temperature sensor 814B is coupled to, such as in contact with, the surface of the server S2, which is supported by the support structures SS2A and SS2B. The support structures SS2A and SS2B are integrated with our fitted to the outside surfaces of the mounts 812A and 812B. The support structures SS2A and SS2B are located below the support structures SS1A and SS1B. An example of a temperature sensor includes a resistance temperature detector, such as a variable resistor. The processor 804 is coupled to the temperature sensors 814A and 814B. Moreover, the processor 804 is coupled to the valve drivers 808A through 808D.

The temperature sensor 814A measures the temperature of the server S1 and provides the temperature to the processor 804. Upon determining that the measured temperature received from the temperature sensor 814A is outside a predetermined temperature range, the processor 804 sends a control signal to the valve driver 808A, or the valve driver 808B, or both the valve drivers 808A and 808B. The predetermined temperature range is stored within the memory device 806. Upon receiving the control signal, the valve driver 808A generates and sends a drive signal, such as a current signal, to the valve V16 to open the valve V16. The opening of the valve V16 allows air from within the space within the housing of the mount 812A enters into the space, such as the space 302A (FIG. 3), between the support structures SS1A and SS1B to increase an amount of cooling of the server S1. Similarly, upon receiving the control signal, the valve driver 808C generates and sends a drive signal, such as a current signal, to the valve V19 to open, such as completely open or partially open, the valve V19. The opening of the valve V19 increases an amount of air, such as allows air, flowing from within the space within the housing of the mount 812B to enter into the space between the support structures SS1A and SS1B to increase an amount of cooling of the server S1, such as to start cooling the server S1.

The processor 804 determines whether the measured temperature received from the temperature sensor 814A is within the predetermined temperature range. Upon determining that the measured temperature received from the temperature sensor 814A is within the predetermined temperature range, the processor 804 sends a control signal to the valve driver 808A, or the valve driver 808C, or both the valve drivers 808A and 808C. Upon receiving the control signal, the valve driver 808A generates and sends a drive signal, such as a current signal, to the valve V16 to close, such as completely close or partially close, the valve V16. The closing of the valve V16 reduces an amount of air, such as prevents air, flowing within the space within the housing of the mount 812A from entering into the space between the support structures SS1A and SS1B to reduce an amount of cooling of the server S1. Similarly, upon receiving the control signal, the valve driver 808C generates and sends a drive signal, such as a current signal, to the valve V19 to close, such as partially or completely close, the valve V19. The closing of the valve V19 reduces an amount of air flowing within the space within the housing of the mount 812B from entering into the space between the support structures SS1A and SS1B to reduce an amount of cooling, such as to stop cooling, of the server S1.

In a similar manner, the valves and V17 and V23 are controlled by the processor 804 via the corresponding drivers 808B and 808D. The temperature sensor 814B measures the temperature of the server S2 and provides the temperature to the processor 804. Upon determining that the measured temperature received from the temperature sensor 814B is outside the predetermined temperature range, the processor 804 sends a control signal to the valve driver 808B, or the valve driver 808D, or both the valve drivers 808B and 808D. Upon receiving the control signal, the valve driver 808B generates and sends a drive signal, such as a current signal, to the valve V17 to open, such as partially or completely open, the valve V17. The opening of the valve V17 allows air from within the space within the housing of the mount 812A enters into the space, such as the space 302B (FIG. 3), between the support structures SS2A and SS2B to increase an amount of cooling of, such as to start cooling, the server S2. Similarly, upon receiving the control signal, the valve driver 808D generates and sends a drive signal, such as a current signal, to the valve V23 to open the valve V23. The opening of the valve V23 allows air from within the space within the housing of the mount 812B enters into the space between the support structures SS2A and SS2B to increase an amount of cooling of, such as to start cooling, the server S2.

The processor 804 determines whether the measured temperature received from the temperature sensor 814B is within the predetermined temperature range. Upon determining that the measured temperature received from the temperature sensor 814B is within the predetermined temperature range, the processor 804 sends a control signal to the valve driver 808B, or the valve driver 808D, or both the valve drivers 808B and 808D. Upon receiving the control signal, the valve driver 808B generates and sends a drive signal, such as a current signal, to the valve V17 to close, such as partially or completely close, the valve V17. The closing of the valve V17 reduces an amount of air, such as prevents air, flowing within the space within the housing of the mount 812A from entering into the space between the support structures SS2A and SS2B to reduce an amount of cooling, such as to stop cooling, of the server S2. Similarly, upon receiving the control signal, the valve driver 808D generates and sends a drive signal, such as a current signal, to the valve V23 to close, such as partially or completely close, the valve V23. The closing of the valve V23 reduces an amount of air, such as prevents air, flowing within the space within the housing of the mount 812B from entering into the space between the support structures SS2A and SS2B to reduce an amount of cooling, such as to stop cooling, the server S2.

In such a manner, each server S1 and S2 is individually cooled are not cooled. This avoids cooling an entire rack which includes the mounts 812A and 812B when not necessary, e.g., when the server S1 or S2 is to be cooled.

In some embodiments, each valve, described herein, is a solenoid valve, which includes multiple magnetic coils 820A and 820B, which are embedded within a housing 822 of the valve. Within a space within the housing 822 is located a solenoid plunger 824 that is connected via a connection mechanism, such as a rod, to a valve stopper 826. Upon receiving a drive signal, the magnetic coil 820A generates an electromagnetic field. The electromagnetic field drives the solenoid plunger 824 to further move the valve stopper 826 in a first direction to close, such as partially or completely close, an opening 828, which is an outlet of the solenoid valve. The closure of the opening 828 reduces an amount of air, such as prevents air, flowing within a hollow, such as a space, within a mount or a post from entering into the space 120 or a portion of the space 120, such as the space between the support structures SS1A and SS2A or the space between the support structures SS2A and SS2B. Upon receiving a drive signal, the magnetic coil 820B generates an electromagnetic field. The electromagnetic field drives the solenoid plunger 824 to further move the valve stopper 826 in a second direction to open, such as partially or completely open, the opening 828. The opening of the opening 828 increases an amount of air, such as allows air, flowing within the hollow within the mount or the post to enter into the space 120 or the portion of the space 120.

In various embodiments, the processor 804 and the temperature sensors 814A and 814B are part of an intelligent platform management interface (IPMI) system to control a temperature of the space between the support structures SS1A and SS2A and the space between the support structures SS2A and SS2B. The IPMI system provides an interface via the display device 818 to display a temperature of the server S1 and a temperature of the server S2. Moreover, the IPMI system provides other information, such as operating voltages of the servers S1 and S2, whether fans within the servers S1 and S2 are operating, etc. For example, the processor 804 determines from the IPMI system, that the server S2 has greater power usage, such as 50%, compared to power usage of the server S1. The power usage of the server S1 is for example, 20%. The processor 804 controls corresponding outlets of one or both the valves V16 and V19 to open more compared to corresponding outlets of one or both the valves V17 and V23. This allows the server S1 to cool at a faster rate compared to the server S2.

In various embodiments, any other parameter, other than power usage, of the IPMI system that provides an indication to the processor 804 that the server S1 is generating a higher amount of heat compared to an amount of heat generated by the server S2 is used.

Figure 9:
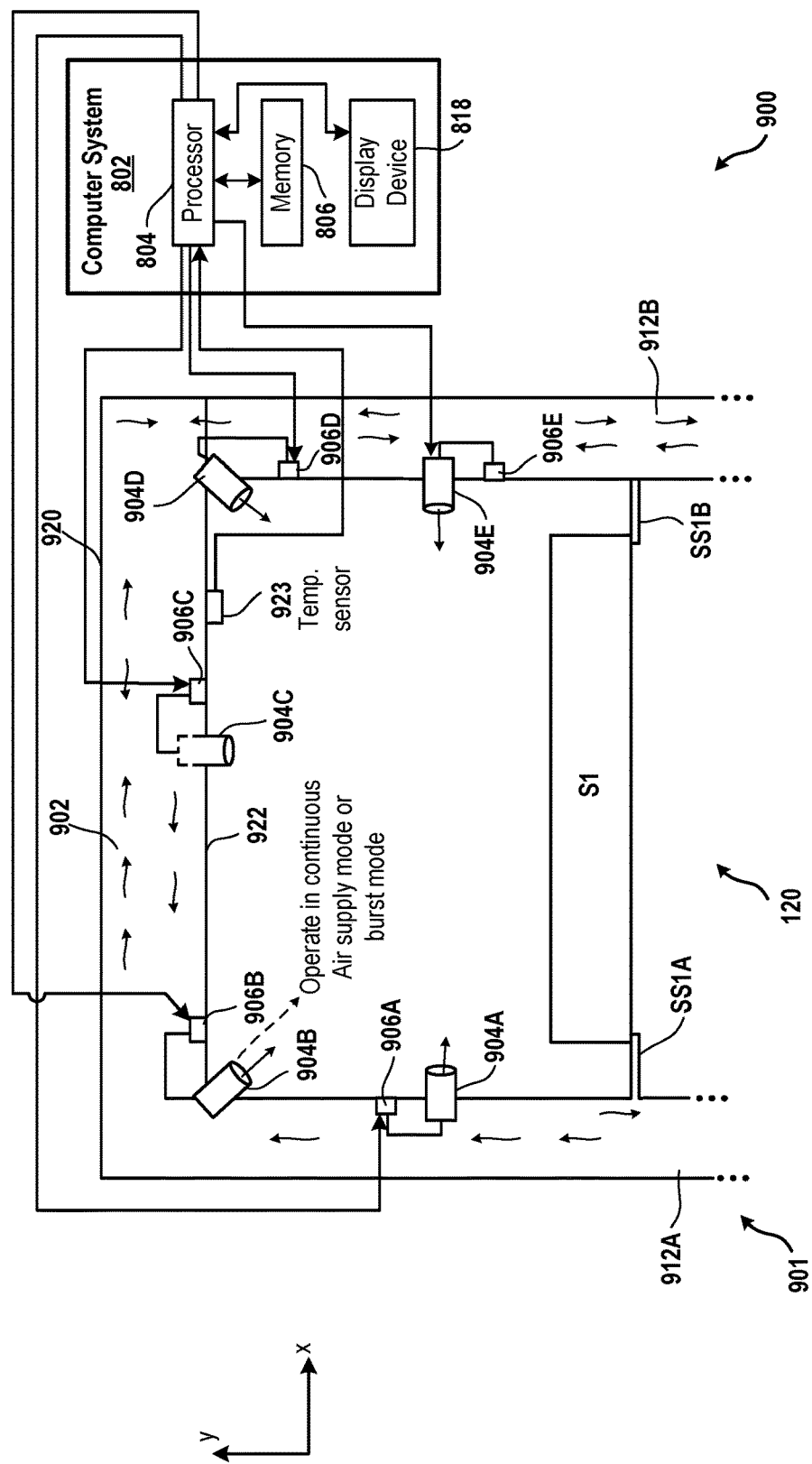
FIG. 9 is a diagram of an embodiment of a system to illustrate a control of opening and closing multiple valves of a server rack.

FIG. 9 is a diagram of an embodiment of a system 900 to illustrate a control of opening and closing multiple valves of the server rack 901. The system 900 includes the computer system 802 and the server rack 901. The server rack 901 has multiple mounts 912A and 912B and a post 902. The post 902 is an example of the post P3 of FIG. 1B. Moreover, the mount 912A is an example of the mount M1 of FIG. 1B and the mount 912B is an example of the mount M2 of FIG. 1B.

The post 902 is fitted with, such as attached or screwed to, a valve 904C, a valve 904B, and a valve 904D. The valve 904C is fitted to a position that is approximately in the middle of a length, in the horizontal direction, of the post 902. The valve 904B is fitted at a first corner of the post 902. The first corner falls at an intersection of the mount 912A and the post 902. Similarly, the valve 904D is fitted at an opposite second corner of the post 902. The second corner falls at an intersection of the mount 912B and the post 902. The space 120 is formed between the mounts 912A and 912B.

In addition, a valve driver 906B, another valve driver 906C, and another valve driver 906D are fitted to an internal surface of the post 902. The internal surface of the post 902 faces a space within the post 902. The valve driver 906B is coupled to the valve 904B. Similarly the valve driver 906C is coupled to the valve 904C and the valve driver 906D is coupled to the valve 904D.

Similarly, the mount 912A is fitted with, such as attached or screwed to, a valve 904A and the mount 912B is fitted with a valve 904E. In addition, a valve driver 906A is fitted to an internal surface of the mount 912A. The valve driver 906A is coupled to the valve 904A. The internal surface of the mount 912A faces a space within the mount 912B. Also, a valve driver 906E is fitted to an internal surface of the mount 912B. The valve driver 906E is coupled to the valve 904E. The internal surface of the mount 912B faces a space within the mount 912B.

The support structure SS1A is fitted to, such as glued to, screwed to, etc., or integrated with an outside surface of the mount 912A. Similarly, the support structure SS1B is fitted to or integrated with an outside surface of the mount 912B. The outside surfaces of the mounts 912A and 912B face the space 120 between the mounts 912A and 912B. In addition, a temperature sensor 923 is fitted, such as screwed to, glued to, or a combination thereof, to the bottom surface 922 of the post 902.

It should be noted that all the valves 904A through 904E and the temperature sensor 923 are located between a top surface 920 of the post 902 and the support structures SS1A and SS1B. The top surface 920 faces a direction that is opposite to a direction in which a bottom surface 922 faces. The bottom surface 922 faces the space 120. It should be noted that in an embodiment in which the post 902 has a round cross section, in the horizontal direction, the surfaces 920 and 922 are one surface.

The processor 804 is coupled to the valve drivers 906A through 906E. The processor 804 controls the valves 904A through 904E by the respective valve drivers 906A through 906E in a manner similar to that described above for controlling the valves V16 through V23 of FIG. 8.

The temperature sensor 923 measures a temperature of the space 120 or a space between a horizontal plane that passes through the support structures SS1A and SS2A and the bottom surface 922 and provides the temperature to the processor 804. The space between the horizontal plane that passes through the support structures SS1A and SS2A and the bottom surface 922 is a portion of the space 120. The processor 804 determines whether the measured temperature received from the temperature sensor 923 is within a preset temperature range. The preset temperature range is stored in the memory device 806. Upon determining that the measured temperature received from the temperature sensor 923 is outside the preset temperature range, the processor 804 sends a control signal to one or more of the valve drivers 906A through 906E. Upon receiving the control signal, each valve driver 906A through 906E generates and sends a drive signal, such as a current signal, to the respective one of the valves 904A through 904E to open, such as partially or completely open, the respective one of the valves 904A through 904E. The opening of one or more of the valves 904A through 904E increases an amount of air, such as allows air, flowing within the space within a housing of the mount 912A, the space within a housing of the mount 912B, and/or the space within a housing of the post 902 to enter into the space between the horizontal plane passing through the support structures SS1A and SS1B and the bottom surface 922 to cool the servers within the space 120.

Upon determining that the measured temperature received from the temperature sensor 923 is within the preset temperature range, the processor 804 sends a control signal to one or more of the valve drivers 906A through 906E. Upon receiving the control signal, each valve driver 906A through 906E generates and sends a drive signal, such as a current signal, to the respective one of the valves 904A through 904E to close, such as partially or completely close, the valve. The closing of the one or more of the valves 904A through 904E reduces an amount of air, such as stops air, from flowing from the space within the housing of the mount 912A, the space within the housing of the mount 912B, and/or the space within the housing of the post 902 into the space between the horizontal plane passing through the support structures SS1A and SS1B and the bottom surface 922 to reduce an amount of cooling, such as to stop cooling, of the servers within the space 120.

In various embodiments, the valve 904C is fitted to a position at any point along the length of the post 902.

In several embodiments, any number of valves are fitted or integrated to respective positions along the length of the post 902.

In various embodiments, any number of valves are fitted or integrated to respective positions along a length, in the vertical direction, of the mount 912A or the mount 912B.

In some embodiments, the post 902 is an example of the post P1 of FIG. 1B. Moreover, the mount 912A is an example of the mount M4 of FIG. 1B and the mount 912B is an example of the mount M3 of FIG. 1B.

Figure 10:
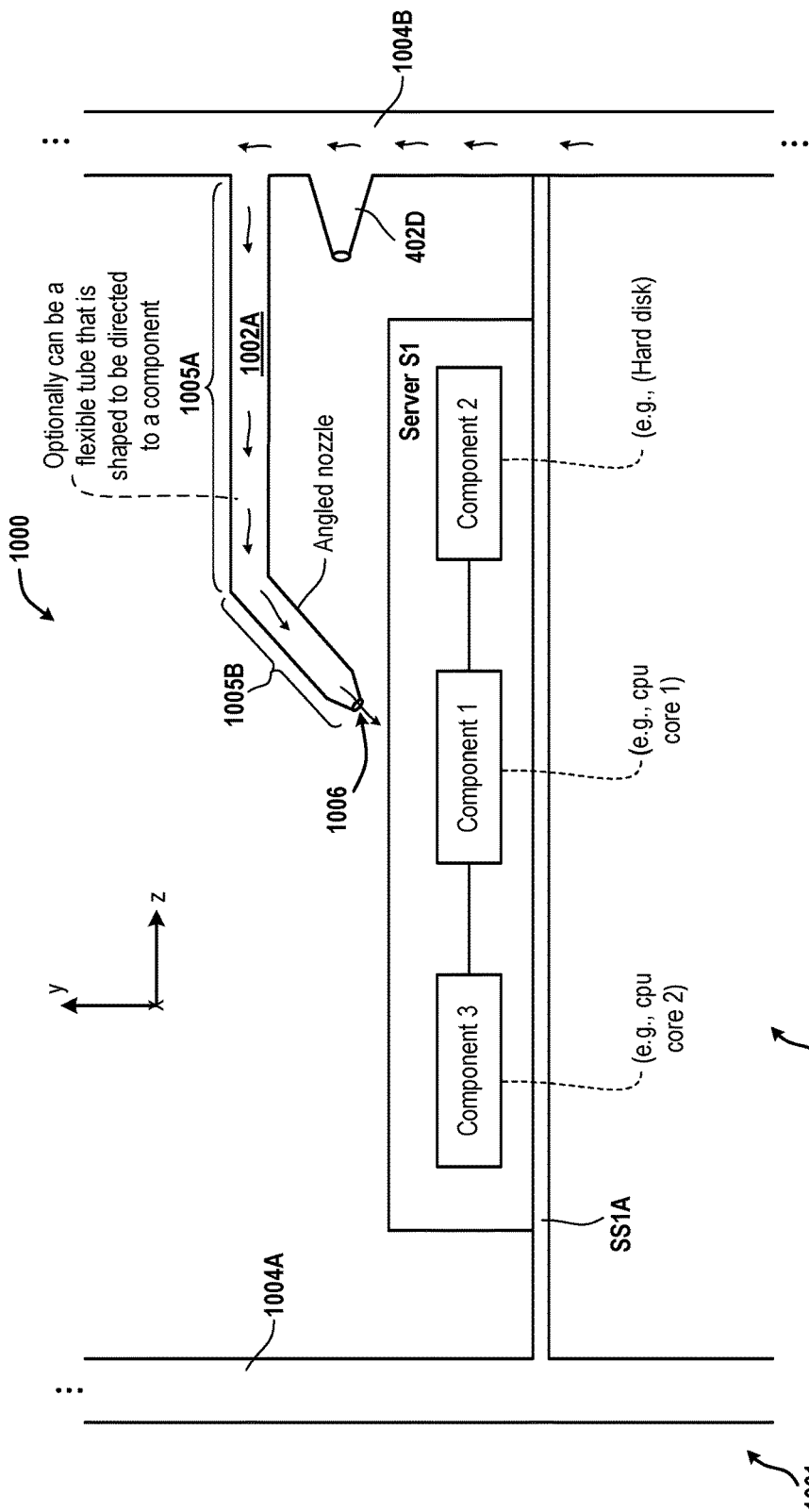
FIG. 10 is a diagram of an embodiment of a system to illustrate an extended valve for cooling a component of a server.

FIG. 10 is a diagram of an embodiment of a system 1000 to illustrate an extended valve 1002A for cooling a component of a server, such as the server S1. The extended valve 1002A is extended in the horizontal direction compared to the valve 402D. For example, a distance, in the horizontal direction, between an outlet 1006 of the valve 1002A and a mount 1004B is greater than a distance, in the horizontal direction, between an outlet of the valve 402D and the mount 1004B. The system 1000 includes a server rack 1001, which has a mount 1004A and the mount 1004B. The mount 1004A is an example of the mount M4 and the mount 1004B is an example of the mount M1 of FIG. 1B.

The server S1 includes multiple components, such as a component 1, a component 2, and a component 3. An example of a component of a server includes a hard disk or a central processing unit (CPU) or a processor or a solid-state drive or an adapter card. To illustrate, the component 1 is a core 1, the component 2 is a hard disk, and the component 3 is a core 2. As another illustration, the component 1 is a first CPU, the component 2 is a hard disk drive, and the component 3 is a second CPU. The component 1 is coupled to the component 2 and the component 3. The component 2 is located closer to the mount 1004B compared to the component 1, and the component 1 is located closer to the mount 1004B compared to the component 3.

The extended valve 1002A extends in the horizontal direction from the mount 1004B to reach the component 1. The extended valve 1002A has a body 1005A and an extended portion 1005B, which extends from the body 1005A towards the component 1. An example of the extended portion 1005B is a valve, such as a solenoid valve. An example of the body 1005A is a tube, made from plastic or metal. The tube of the body 1005A has a cross-section of any shape, such as round, square, polygonal, rectangular, or oval. The body 1005A extends in the horizontal direction from the mount 1004B. The extended portion 1005B is angled, such as forms of angle ranging from including about 30° to about 90°, with respect to the body 1005A.

The extended valve 1002A is integrated within the mount 1004B. For example, during a time of fabrication of the mount 1004B, the extended valve 1002A is fabricated as a part of the mount 1004B.

Air flowing within a space, such as a hollow, within the mount 1004B, flows into the body 1005A to further flow into the extended portion 1005B. The air from the extended portion 1005B flows via the outlet 1006 of the extended portion 1005A to be directed towards the component 1 to cool the component 1. The air that flows out from the outlet 1006 is not directed towards the components 2 and 3.

In some embodiments, the extended valve 1002A is fitted, such as attached to, glued to, screwed to, or combination thereof, to an outer surface of the mount 1004B. The outer surface of the mount 1004B faces the space 120 between amounts 1004A and 1004B.

In various embodiments, the extended valve 1002A is a flexible tube, made from plastic, that is bent to be directed to the component 1.

In some embodiments, the mount 1004A is an example of the mount M3 and the mount 1004B is an example of the mount M2 of FIG. 1B.

In various embodiments, the extended valve 1002A extends further than that illustrated in FIG. 10 so that the outlet 1006 of the extended valve 1002A is closest to the component 3 compared to the components 1 and 2.

In some embodiments, the extended valve 1002A extends less than that illustrated in FIG. 10 so that the outlet 1006 of the extended valve 1002A is closest to the component 2 compared to the components 1 and 3.

In various embodiments, the extended valve 1002A is fitted, such as screwed to or glued to or a combination thereof, or integrated with any of the mounts M1 through M4.

In some embodiments, another extended valve, such as extended valve 1002A, is integrated with or fitted to the mount 1004B and has a body and an extended portion that is directed towards the component 1 or the component 3.

In various embodiments, multiple extended valves, such as the extended valve 1002A, are integrated with their fitted to the mount 1004B. A first one of the extended valves has a body and an extended portion that is directed towards the component 1. A second one of the extended valves has a body and an extended portion that is directed towards the component 3.

It should be noted that the term integrated with, in some embodiments, is used to indicate that a portion that is integrated with another portion is fabricated as a part of that other portion during manufacturing. For example, when the extended valve 1002A is integrated within the mount 1004B, the extended valve 1002A is fabricated as a part of a housing of the mount 1004B.

In some embodiments, the extended valve 1002A is angled with respect to the mount 1004B in a direction of the x-axis so that the outlet 1006 is closest to the component 1 compared to the components 2 and 3. To illustrate, the body 1005A forms an angle ranging from and including about 10 degrees to about 70 degrees with respect to the mount 1004B.

Figure 11:
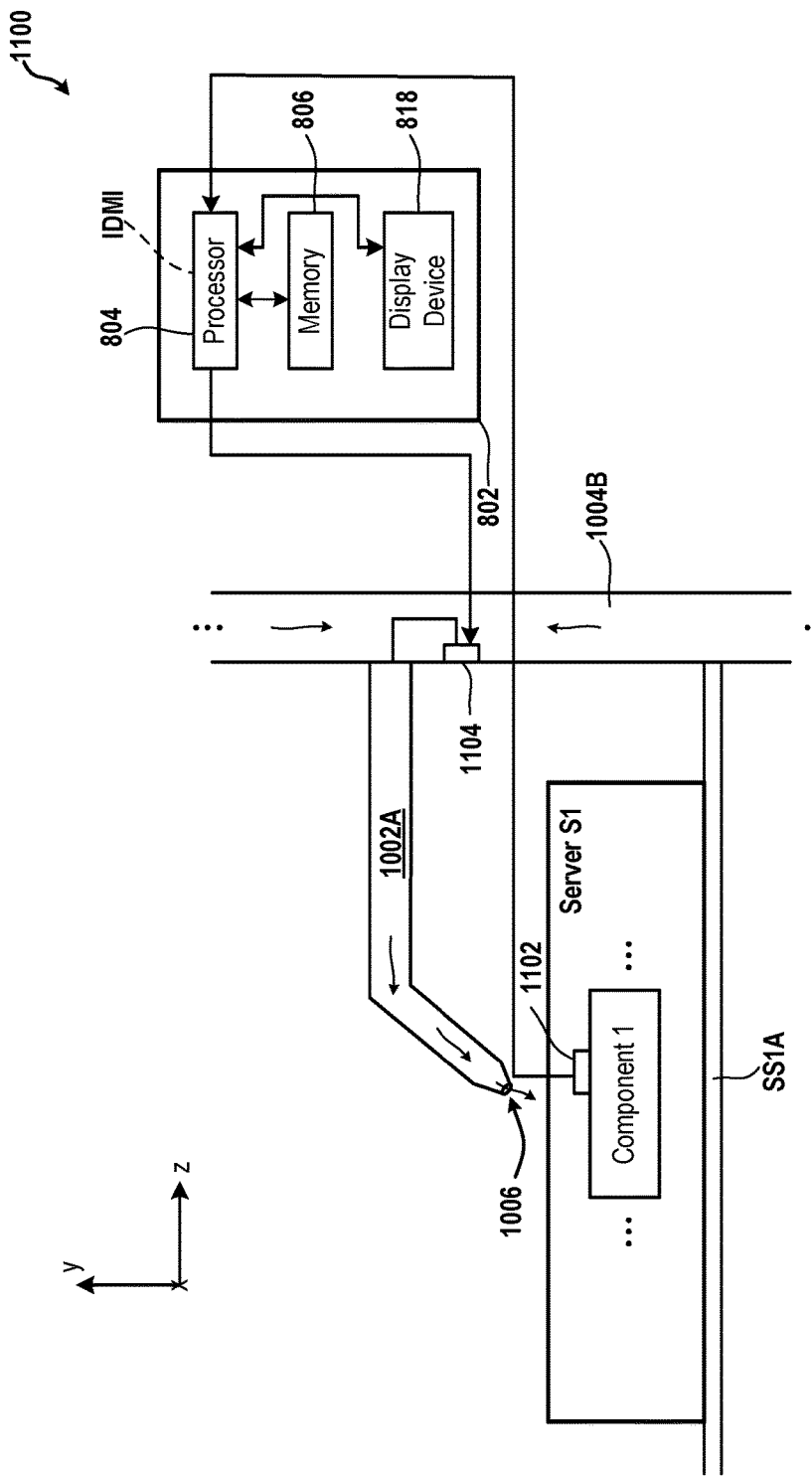
FIG. 11 is a diagram of an embodiment of a system to illustrate control of the extended valve based on a temperature that is sensed by a temperature sensor associated with a component of a server.

FIG. 11 is a diagram of an embodiment of the system 1100 to illustrate control of the extended valve 1002A based on a temperature that is sensed by a temperature sensor 1102. The system 1100 includes the computer system 802, the mount 1004B, the extended valve 1002A, and the server S1.

A valve driver 1104 is mounted, such as attached to, fitted to, screwed to, to an inside surface of the mount 1004B. The inside surface of the mount 1004B faces a space within a housing of the mount 1004B. The valve driver 1104 is coupled to the extended valve 1002A.

Also, the temperature sensor 1106 is coupled to, such as in contact with, a surface of the component 1 of the server S1, which is supported by the support structures SS1A and SS1B. The processor 804 is coupled to the valve driver 1104.

The temperature sensor 1106 measures a temperature of the component 1 and provides the temperature to the processor 804. Upon determining that the measured temperature received from the temperature sensor 1106 is outside a predefined temperature range, the processor 804 sends a control signal to the valve driver 1104. The predefined temperature range is stored within the memory device 806. Upon receiving the control signal, the valve driver 1104 generates and sends a drive signal, such as a current signal, to the valve 1002A to open, such as completely or partially open, the outlet 1006. The opening of the valve 1002A and the outlet 1006 increases an amount of air flowing within the space within the housing of the mount 812A to exit via the extended valve 1002A and the outlet 1006 towards the component 1 to cool the component 1 of the server S1 supported by the support structures SS1 and SS2.

The processor 803 determines whether the measured temperature received from the temperature sensor 1106 is within the predefined temperature range. Upon determining that the measured temperature received from the temperature sensor 1106 is within the predefined temperature range, the processor 804 sends a control signal to the valve driver 1104. Upon receiving the control signal, the valve driver 1104 generates and sends a drive signal, such as a current signal, to the valve 1002A to close, such as partially or completely close, the outlet 1006 of the valve 1002A. The closing of the outlet 1006 reduces an amount of air, such as prevents air, flowing within the space within the housing of the mount 1004B from exiting via the valve 1002A and the outlet 1006 towards the component 1 to reduce an amount of cooling, such as to stop cooling, of the component 1.

In such a manner, each component of the server S1 is individually cooled are not cooled via the extended valve 1002A.

In various embodiments, the processor 804 and the temperature sensor 1106 are parts of the IPMI system to control a temperature of the component 1. The IPMI system provides an interface via the display device 818 to display a temperature of each of the components 1 through 3. For example, the processor 804 determines from the IPMI system, that the component 1 has greater power usage, such as 50%, compared to the component 2. The power usage by the component 2 is for example, 20%. The processor 804 controls the outlet 1006 of the extended valve 1002A to open more compared to the outlet of the valve 402D (FIG. 10). The component 2 is closer to the outlet of the valve 402D compared to the component 1 and the component 1 is closer to the outlet 1006 compared to the component 2. This allows the component 1 to cool at a faster rate compared to the component 2.

In some embodiments, each valve, described herein, operates in a burst mode. In the burst mode, each valve is controlled by the processor 804 to open or close at a pre-determined frequency. For example, repeatedly after each pre-determined time period, the processor 804 sends a control signal to the valve to open or close the valve to operate the valve in the burst mode.

In various embodiments, any other parameter, other than power usage, of the IPMI system that provides an indication to the processor 804 that the component 1 is generating a higher amount of heat compared to an amount of heat generated by the component 2 is used.

Although various embodiments of the present invention have been described in some detail for purposes of clarity of understanding, it will be apparent that certain changes and modifications can be practiced within the scope of the appended claims. Accordingly, the present embodiments are to be considered as illustrative and not restrictive, and the invention is not to be limited to the details given herein, but may be modified within the scope and equivalents of the appended claims.

The invention claimed is:

1. A data center comprising:
a first server rack configured to receive one or more servers;
a second server rack, wherein each of the first and second server racks includes a tubular frame having a hollow space therein, wherein the first server rack is coupled to the second server rack via a rack-to-rack connector;
a cooling supply coupled to the first server rack via a cooling transfer medium, when the cooling supply is configured to operate to supply a cooling gas via the cooling transfer medium and the hollow space within a housing of the first server rack to the hollow space within a housing of the second server rack,
wherein the housing of the first server rack has one or more valves for controlling a supply of the cooling gas to a space associated with the first server rack.

2. The data center of claim 1, wherein the first server rack has a plurality of sets of support structures, wherein each set of support structures is configured to support a server, wherein one of the valves is directed towards a first space between one of the sets of support structures and another one of the valves is directed towards a second space between another one of the sets of support structures.

3. The data center of claim 1, wherein the first server rack has a plurality of sets of support structures, wherein each set of support structures is configured to support a server, wherein one of the valves is located between one of the sets of support structures and another one of the sets of support structures.

4. The data center of claim 1, wherein the first server rack has a plurality of sets of support structures, wherein each set of support structures is configured to support a server, wherein one of the valves is located between a top portion of the tubular frame of the first server rack and one of the sets of support structures.

5. The data center of claim 1, wherein one of the valves has an outlet that is directed from a top portion of the first server rack towards a space between mounts of the tubular frame of the first server rack.

6. The data center of claim 1, further comprising one or more booster fans located within the hollow space of the first server rack to increase pressure of the cooling gas transferred via the one or more valves to a space between mounts of the tubular frame of the first server rack.

7. The data center of claim 1, wherein the first server rack has a plurality of sets of support structures, wherein one of the valves is directed towards a first space between one of the sets of support structures and another one of the valves is directed towards a second space between another one of the sets of support structures, the data center further comprising a controller coupled to the one of the valves to open and close the one of the valves directed towards the first space to further modify a temperature of a server supported by the one of the sets of support structures.

8. The data center of claim 1, further comprising a controller coupled to one of the valves to open and close one of the valves based on a temperature within a space between mounts and between posts of the tubular frame of the first server rack.

9. The data center of claim 8, wherein the temperature is of one of the servers.

10. The data center of claim 1, wherein one of the valves is extended compared to another one of the valves, wherein the extended valve is closer to a component of one of the servers compared to the other one of the valves.

11. A server rack comprising:
a tubular frame having a hollow space therein,
wherein the tubular frame has a plurality of mounts, a top portion, and a bottom portion,
wherein the bottom portion is configured to be coupled via a cooling transfer medium to a cooling supply,
wherein the tubular frame is configured to be coupled to another server rack via a rack-to-rack connector,
wherein the tubular frame has a plurality of sets of support structures configured to support one or more servers,
wherein the tubular frame has one or more valves for controlling a supply of a cooling gas to a space between the mounts.

12. The server rack of claim 11, wherein one of the valves is directed towards a first space between one of the sets of support structures and another one of the valves is directed towards a second space between another one of the sets of support structures.

13. The server rack of claim 11, wherein one of the valves is located between one of the sets of support structures and another one of the sets of support structures.

14. The server rack of claim 13, wherein the one of the valves is configured to open and close based on a temperature of one of the servers supported by the other one of the sets of support structures.

15. The server rack of claim 11, wherein one of the valves has an outlet that is directed from the top portion of the server rack towards a space between the mounts of the tubular frame of the server rack.

16. The server rack of claim 15, wherein the one of the valves is configured to open and close based on a temperature of one of the servers.

17. A server rack comprising:
a tubular frame having:
a plurality of mounts oriented in a vertical direction;
a top portion coupled to the mounts and oriented in a horizontal direction that is substantially perpendicular to the vertical direction; and
a bottom portion coupled to the mounts and oriented in the horizontal direction, wherein each of the mounts, the top portion, and the bottom portion has a hollow space therein; and
a plurality of sets of support structures supported between the mounts,
wherein the tubular frame is integrated with one or more valves for controlling a supply of a cooling gas via the one or more valves to a space between the mounts.

18. The server rack of claim 17, wherein the bottom portion is configured to be coupled via a cooling transfer medium to a cooling supply to receive the cooling gas from the cooling supply for transfer via the one or more valves to a server that is supported by one of the sets of support structures.

19. The server rack of claim 17, wherein one of the valves is configured to open and close based on a temperature of a server that is supported by one of the sets of support structures.

20. The server rack of claim 17, wherein the tubular frame is configured to be coupled to another server rack via a rack-to-rack connector.

* * * * *